US012189881B2

(12) United States Patent
Wang et al.

(10) Patent No.: US 12,189,881 B2
(45) Date of Patent: Jan. 7, 2025

(54) TOUCH DISPLAY PANEL AND DISPLAY DEVICE

(71) Applicants:CHENGDU BOE OPTOELECTRONICS TECHNOLOGY CO., LTD., Chengdu (CN); BOE TECHNOLOGY GROUP CO., LTD., Beijing (CN)

(72) Inventors: Ge Wang, Beijing (CN); Zhiliang Jiang, Beijing (CN); Qing He, Beijing (CN); Xiangnan Pan, Beijing (CN); Qingqing Yan, Beijing (CN); Xiaomin Yuan, Beijing (CN); Zaiyong Long, Beijing (CN); Min Chen, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/549,656

(22) PCT Filed: Jan. 3, 2023

(86) PCT No.: PCT/CN2023/070064
§ 371 (c)(1),
(2) Date: Sep. 8, 2023

(87) PCT Pub. No.: WO2023/131106
PCT Pub. Date: Jul. 13, 2023

(65) Prior Publication Data
US 2024/0152226 A1    May 9, 2024

(30) Foreign Application Priority Data

Jan. 4, 2022    (CN) .......................... 202210002470.6

(51) Int. Cl.
*G06F 3/041* (2006.01)
*G06F 3/044* (2006.01)
*H10K 59/40* (2023.01)

(52) U.S. Cl.
CPC .......... *G06F 3/0412* (2013.01); *G06F 3/0446* (2019.05); *H10K 59/40* (2023.02)

(58) Field of Classification Search
None
See application file for complete search history.

(56) References Cited

U.S. PATENT DOCUMENTS 6,292,248 B1    9/2001 Lee et al.
9,859,520 B2    1/2018 Kim
(Continued)

FOREIGN PATENT DOCUMENTS

CN    106206645 A    12/2016
CN    106293258 A    1/2017
(Continued)

*Primary Examiner* — Brian M Butcher
(74) *Attorney, Agent, or Firm* — Westman, Champlin & Koehler, P.A.

(57) ABSTRACT

A touch display panel includes: a base substrate, including a display area and a peripheral area on at least one side of the display area; pixel units in the display area, including a pixel driving circuit and a light-emitting element electrically connected to each other; touch electrodes in the display area; a touch wire electrically connected to at least one touch electrode, at least part of which extends to the peripheral area; a touch lead in the peripheral area, where the touch lead and the touch wire are in different conductive layers; and a contact groove in the peripheral area, where the touch wire and the touch lead are in contact in the contact groove, where the touch wire has a first touch wire portion in the contact groove, and the first touch wire portion extends obliquely with respect to an upper surface of the base substrate.

17 Claims, 21 Drawing Sheets

(56) References Cited

U.S. PATENT DOCUMENTS

| | | |
|---|---|---|
| 10,340,326 B2 | 7/2019 | Yuan et al. |
| 10,394,374 B2 | 8/2019 | Zeng et al. |
| 11,693,498 B2 | 7/2023 | Cheng et al. |
| 2012/0286648 A1 | 11/2012 | Pang et al. |
| 2014/0048781 A1 | 2/2014 | Chang |
| 2016/0149155 A1 | 5/2016 | Kim |
| 2016/0351860 A1 | 12/2016 | Lee et al. |
| 2018/0059862 A1 | 3/2018 | Zeng et al. |
| 2018/0095567 A1* | 4/2018 | Lee ................. G06F 3/0446 |
| 2018/0197935 A1 | 7/2018 | Yuan et al. |
| 2022/0283657 A1 | 9/2022 | Cheng et al. |

FOREIGN PATENT DOCUMENTS

| | | |
|---|---|---|
| CN | 106951125 A | 7/2017 |
| CN | 107394056 A | 11/2017 |
| CN | 108054188 A | 5/2018 |
| CN | 108845709 A | 11/2018 |
| CN | 112799550 A | 5/2021 |
| CN | 217521581 U | 9/2022 |

\* cited by examiner

TOUCH DISPLAY PANEL AND DISPLAY DEVICE

CROSS REFERENCE TO RELATED APPLICATION(S)

This application is a Section 371 National Stage Application of International Application No. PCT/CN2023/070064, filed on Jan. 3, 2023, which published as WIPO Publication No. WO 2023/131106 A1, on Jul. 13, 2023, not in English, which claims priority to Chinese patent Application No. 202210002470.6, filed on Jan. 4, 2022, the disclosures of which are incorporated herein by reference in their entireties.

TECHNICAL FIELD

The present disclosure relates to a field of display technology, and in particular to a touch display panel and a display device.

BACKGROUND

An organic electroluminescent (OLED) display device is an organic electroluminescent diode-based display device. It has excellent characteristics such as self-illumination, high contrast, small thickness, wide viewing angle, fast response speed, applicability to flexible panels, usability in wide operating temperature range, simple structure and manufacturing process, etc., and has attracted increasing attention, with broad application prospects. In a related art, a touch function is integrated by means of embedding a touch structure in an OLED display module, so as to achieve an integration of a display function and a touch function of the OLED display device.

With a development of technology, narrow-frame OLED display devices are increasingly widely used. Reducing a frame width of an OLED display device has become one of important research topics for researchers in related technical fields.

The above information disclosed in this section is merely for the understanding of the background of technical concepts of the present disclosure. Therefore, the above information may contain information that does not constitute a related art.

SUMMARY

In an aspect, a touch display panel is provided, including:
a base substrate, where the base substrate includes a display area and a peripheral area at least on at least one side of the display area;
a plurality of pixel units in the display area, where the pixel unit includes a pixel driving circuit and a light-emitting element electrically connected to the pixel driving circuit, and the light-emitting element includes a first electrode;
a plurality of touch electrodes in the display area;
a touch wire electrically connected to at least one touch electrode, where at least part of the touch wire extends to the peripheral area;
a touch lead in the peripheral area, where the touch lead and the touch wire are located in different conductive layers; and
a contact groove in the peripheral area, where the touch wire and the touch lead are in contact with each other in the contact groove,
where the touch wire includes a first touch wire portion in the contact groove, the base substrate has an upper surface close to the pixel units, and the first touch wire portion extends obliquely with respect to the upper surface of the base substrate.

According to some exemplary embodiments, the first touch wire portion is located on a groove bottom of the contact groove.

According to some exemplary embodiments, the touch lead includes a first touch lead portion and a second touch lead portion, the second touch lead portion serves as the groove bottom of the contact groove, the first touch lead portion is on a side of the second touch lead portion close to the display area, the first touch lead portion extends parallel to the upper surface of the base substrate, and the second touch lead portion extends obliquely with respect to the upper surface of the base substrate.

According to some exemplary embodiments, the first touch wire portion is located on a groove sidewall of the contact groove.

According to some exemplary embodiments, the touch lead includes a first touch lead portion, a second touch lead portion and a fourth touch lead portion, the second touch lead portion serves as a groove bottom of the contact groove, the fourth touch lead portion serves as a part of the groove sidewall of the contact groove, the first touch lead portion is on a side of the second touch lead portion close to the display area, and the fourth touch lead portion is between the first touch lead portion and the second touch lead portion. The first touch lead portion extends parallel to the upper surface of the base substrate, the second touch lead portion extends parallel to the upper surface of the base substrate, and the fourth touch lead portion extends obliquely with respect to the upper surface of the base substrate. The first touch wire portion is in contact with the fourth touch lead portion.

According to some exemplary embodiments, the touch wire further includes a second touch wire portion in the contact groove, and the second touch wire portion is in contact with the second touch lead portion.

According to some exemplary embodiments, a width of a contact portion of the first touch wire portion and the second touch lead portion in an extension direction of the first touch wire portion is equal to a width of the contact groove in the extension direction of the first touch wire portion.

According to some exemplary embodiments, a width of a contact portion of the second touch wire portion and the second touch lead portion in an extension direction of the second touch wire portion is equal to a width of the contact groove in the extension direction of the second touch wire portion.

According to some exemplary embodiments, the touch display panel further includes a first supporting structure, where the first supporting structure includes a first surface away from the base substrate, the first surface has a first portion, and an orthographic projection of the contact groove on the base substrate substantially coincides with an orthographic projection of the first portion of the first surface on the base substrate. The first portion of the first surface extends obliquely with respect to the upper surface of the base substrate According to some exemplary embodiments, the first portion of the first surface has a first end close to the display area and a second end away from the display area, and a height of the first portion of the first surface at the second end is less than a height of the first portion of the first surface at the first end.

According to some exemplary embodiments, a difference between the height of the first portion of the first surface at the first end and the height of the first portion of the first surface at the second end ranges from 0.5 microns to 50 microns.

According to some exemplary embodiments, the second touch lead portion is in direct contact with the first portion of the first surface.

According to some exemplary embodiments, the touch display panel further includes a first supporting structure, where the fourth touch lead portion is on a sidewall of the first supporting structure away from the display area.

According to some exemplary embodiments, the first supporting structure includes a first surface away from the base substrate, the first surface includes a first portion, and the first portion of the first surface extends obliquely with respect to the upper surface of the base substrate. The fourth touch lead portion is in contact with the first portion of the first surface.

According to some exemplary embodiments, the first surface further includes a second portion on a side of the first portion of the first surface close to the display area, and the second portion of the first surface extends parallel to the upper surface of the base substrate.

According to some exemplary embodiments, the touch display panel further includes a second supporting structure on a side of the first supporting structure away from the base substrate, where an orthographic projection of the second supporting structure on the base substrate at least partially overlaps with an orthographic projection of the second portion of the first surface on the base substrate. A part of the first touch lead portion is sandwiched between the first supporting structure and the second supporting structure.

According to some exemplary embodiments, the touch display panel further includes a first encapsulation sub-layer, a second encapsulation sub-layer and a third encapsulation sub-layer sequentially arranged away from the base substrate. The touch display panel further includes a first covering structure in the peripheral area, and the first covering structure is located in at least one of the first encapsulation sub-layer and the third encapsulation sub-layer. An orthographic projection of a side surface of the first covering structure away from the display area on the base substrate falls within the orthographic projection of the second portion of the first surface on the base substrate.

According to some exemplary embodiments, the first touch lead portion is in direct contact with the second portion of the first surface.

According to some exemplary embodiments, the light-emitting element further includes a second electrode and a light-emitting layer between the first electrode and the second electrode, the pixel driving circuit includes a storage capacitor and at least one thin film transistor on the base substrate, the thin film transistor includes an active layer, a gate electrode, a source electrode and a drain electrode, and the storage capacitor includes a first electrode plate and second electrode plate;

where the touch display panel includes:
a first conductive layer on a side of the active layer away from the base substrate, where the gate electrode and the first electrode plate are in the first conductive layer;
a second conductive layer on a side of the first conductive layer away from the base substrate, where the second electrode plate is located in the second conductive layer;

a third conductive layer on a side of the second conductive layer away from the base substrate, where the source electrode and the drain electrode are in the third conductive layer; and
a fourth conductive layer on a side of the third conductive layer away from the base substrate, where a connecting portion for electrically connecting the pixel driving circuit and the first electrode of the light-emitting element is in the fourth conductive layer,
where the touch lead is located in the fourth conductive layer.

According to some exemplary embodiments, the touch display panel further includes: a first touch layer on a side of the third encapsulation sub-layer away from the base substrate; and a second touch layer on a side of the first touch layer away from the base substrate. The touch wire is in the first touch layer or the second touch layer.

According to some exemplary embodiments, the touch display panel further includes a first planarization layer between the third conductive layer and the fourth conductive layer, where the first supporting structure is in the first planarization layer.

According to some exemplary embodiments, the touch display panel further includes a second planarization layer between the fourth conductive layer and a layer where the first electrode of the light-emitting device is located, where the second supporting structure is located in the second planarization layer.

According to some exemplary embodiments, the touch display panel includes a plurality of insulating layers between the fourth conductive layer and the base substrate, where the first supporting structure includes a structure located in at least one of the plurality of insulating layers.

According to some exemplary embodiments, the first supporting structure includes a first supporting sub-structure in the third conductive layer and a second supporting sub-structure in the first planarization layer.

According to some exemplary embodiments, the first covering structure includes a first portion, and an orthographic projection of the first portion of the first covering structure on the base substrate falls within an orthographic projection of the second supporting structure on the base substrate. The first portion of the first covering structure has a first surface away from the base substrate, and the first surface of the first portion of the first covering structure extends obliquely with respect to the upper surface of the base substrate.

In another aspect, a display device is provided, including the touch display panel described above.

BRIEF DESCRIPTION OF THE DRAWINGS

By describing in detail exemplary embodiments of the present disclosure with reference to the accompanying drawings, features and advantages of the present disclosure will become more apparent.

DETAILED DESCRIPTION OF EMBODIMENTS

Figure 1:
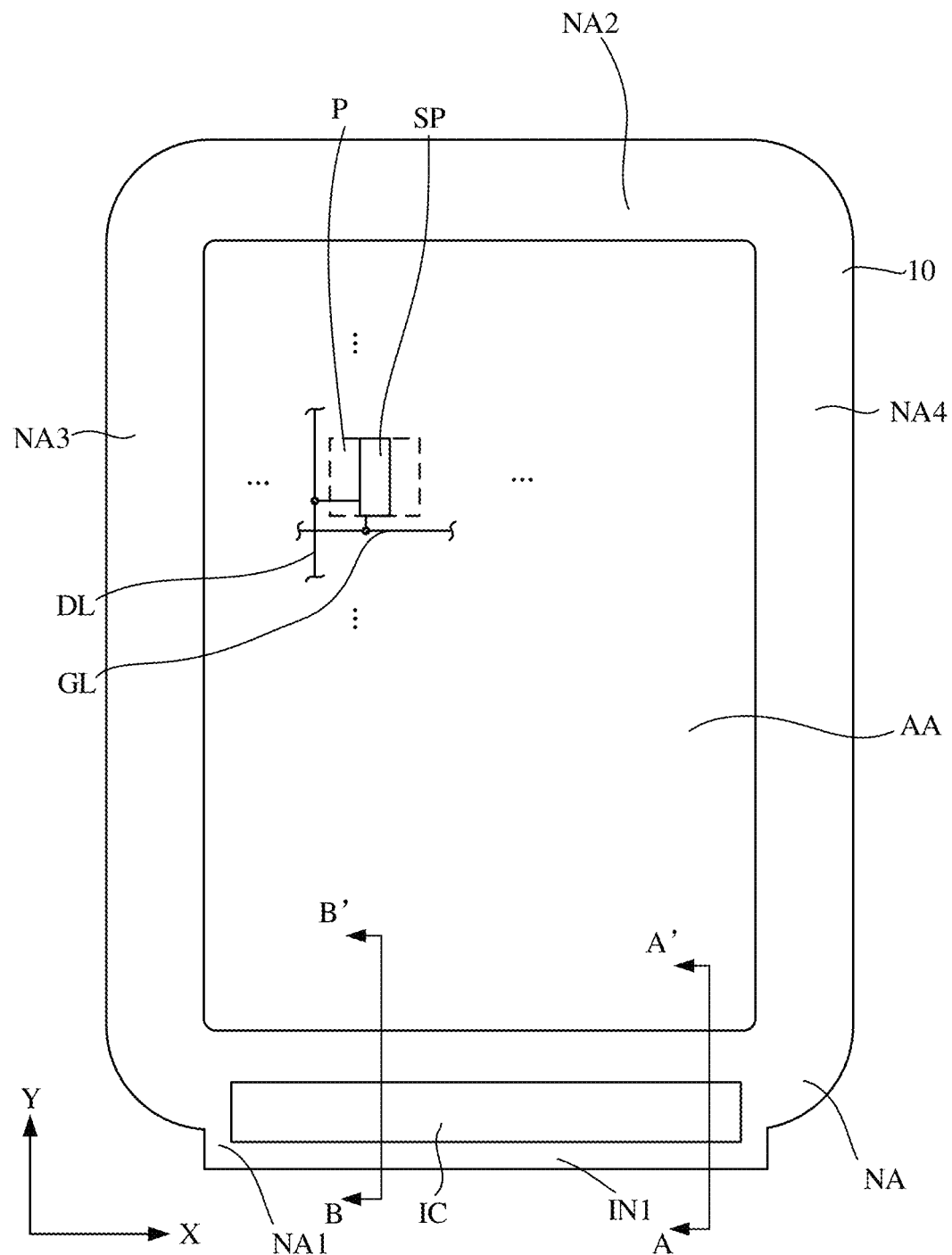
FIG. 1 shows a schematic top view of a touch display panel according to an embodiment of the present disclosure.

In order to make objectives, technical solutions and advantages of the present disclosure clearer, technical solutions of the embodiments of the present disclosure will be clearly and completely described below with reference to the accompanying drawings. Obviously, the described embodiments are merely some embodiments rather than all embodiments of the present disclosure. Based on the described embodiments of the present disclosure, all additional embodiments obtained by those ordinary skilled in the art without carrying out inventive effort fall within the scope of protection of the present disclosure.

It will be noted that in the accompanying drawings, for clarity and/or description purposes, sizes and relative sizes of elements may be enlarged. Accordingly, the size and relative size of each element need not to be limited to those shown in the figures. In the specification and the accompanying drawings, the same or similar reference numerals represent the same or similar components.

When an element is described as being "on", "connected to" or "combined with" another element, the element may be directly on the another element, directly connected to the another element, or directly combined with the another element, or an intermediate element may be provided. However, when an element is described as being "directly on", "directly connected to" or "directly combined with" another element, no intermediate element is provided. Other terms and/or expressions used to describe a relationship between elements, such as "between" and "directly between", "adjacent to" and "directly adjacent to", "on" and "directly on", etc., will be interpreted in a similar manner. Moreover, the term "connection" may refer to a physical connection, an electrical connection, a communication connection, and/or a fluid connection. In addition, X-axis, Y-axis and Z-axis are not limited to three axes of a rectangular coordinate system, and may be interpreted in a broader meaning. For example, the X-axis, the Y-axis and the Z-axis may be perpendicular to each other, or may represent different directions that are not perpendicular to each other. For the objective of the present disclosure, "at least one of X, Y and Z" and "at least one selected from a group consisting of X, Y and Z" may be interpreted as only X, only Y, only Z, or any combination of two or more of X, Y and Z, such as XYZ, XY, YZ and XZ. As used herein, the term "and/or" includes any and all combinations of one or more of the listed related items.

It will be noted that although the terms "first", "second", and so on may be used herein to describe various components, members, elements, regions, layers and/or parts, these components, members, elements, regions, layers and/or parts will not be limited by these terms. Rather, these terms are used to distinguish one component, member, element, region, layer and/or part from another one. Thus, for example, a first component, a first member, a first element, a first region, a first layer and/or a first part discussed below may be referred to as a second component, a second member, a second element, a second region, a second layer and/or a second part without departing from teachings of the present disclosure.

For ease of description, spatial relationship terms, such as "upper", "lower", "left", "right", may be used herein to describe a relationship between one element or feature and another element or feature as shown in the figures. It will be understood that the spatial relationship terms are intended to cover other different orientations of a device in use or operation in addition to the orientation described in the figures. For example, if the device in the figures is turned upside down, an element or feature described as being "below" or "under" another element or feature will be oriented "above" or "on" the another element or feature.

Those skilled in the art will understand that herein, unless otherwise specified, the expression "height" or "thickness" refers to a size in a direction perpendicular to a surface of each film layer arranged in the display panel, that is, a size along a direction in which the display panel emits light, or called a size in a normal direction of a display device.

Herein, unless otherwise specified, the expression "patterning process" generally includes steps of photoresist coating, exposure, development, etching, and photoresist stripping. The expression "one patterning process" means a process of forming patterned layers, components, elements and so on by using one mask.

It will be noted that the expressions "the same layer", "disposed in the same layer" or similar expressions refer to a layer structure formed by firstly using the same film forming process to form a film layer for forming a specific pattern, and then using the same mask to pattern the film layer by using one patterning process. Depending on the specific patterns, the patterning process may include multiple exposure, development or etching processes, and the specific pattern in the formed layer structure may be continuous or discontinuous. These specific patterns may also be at different heights or have different thicknesses.

Herein, unless otherwise specified, the expression "electrically connected" may mean that two components or elements are directly electrically connected. For example, component or element A is in direct contact with component or element B, and an electrical signal may be transmitted between the two. It may also mean that two components or elements are electrically connected through a conductive medium such as a conductive wire. For example, component or element A is electrically connected to component or element B through a conductive wire so as to transmit an electrical signal between the two components or elements. Alternatively, it may also mean that two components or elements are electrically connected through at least one electronic component. For example, component or element A is electrically connected to component or element B through at least one thin film transistor so as to transmit an electrical signal between the two components or elements.

The embodiments of the present disclosure provide at least a touch display panel and a display device. The touch display panel includes: a base substrate, including a display area and a peripheral area at least on at least one side of the display area; a plurality of pixel units in the display area, where the pixel unit includes a pixel driving circuit and a light-emitting element electrically connected to the pixel driving circuit, and the light-emitting element includes a first electrode; a plurality of touch electrodes in the display area; a touch wire electrically connected to at least one touch electrode, where at least part of the touch wire extends to the peripheral area; a touch lead in the peripheral area, the touch lead and the touch wire are located in different conductive layers; and a contact groove in the peripheral area, where the touch wire and the touch lead are in contact with each other in the contact groove. The touch wire includes a first touch wire portion in the contact groove, the base substrate has an upper surface close to the pixel units, and the first touch wire portion extends obliquely with respect to the upper surface of the base substrate. In the embodiments of the present disclosure, the touch wire inclined with respect to the upper surface of the base substrate may be beneficial to the reduction of a width of a region occupied by the touch display panel in the peripheral area, thereby facilitating an implementation of a narrow-frame display device.

Figure 2:
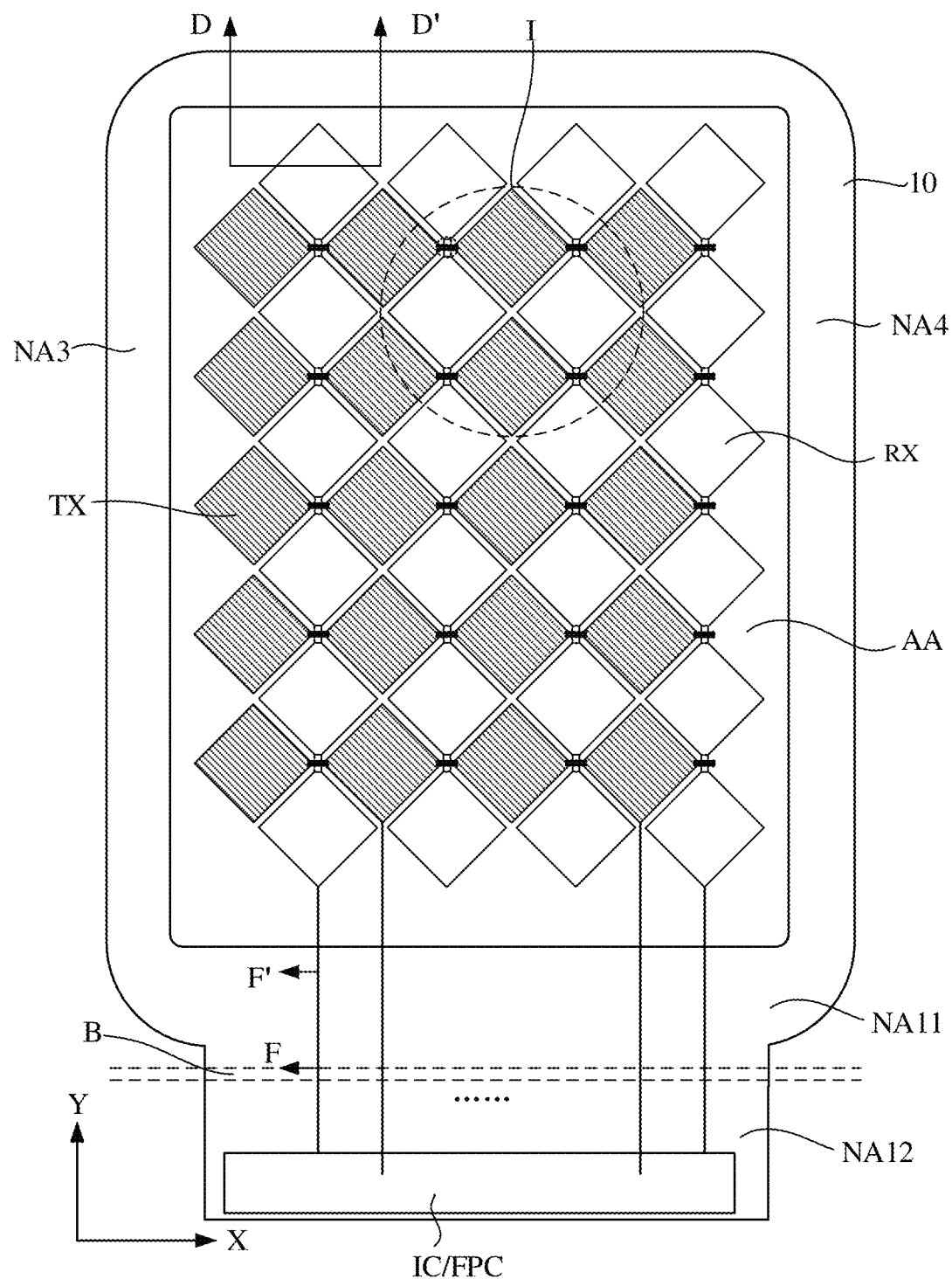
FIG. 2 shows a schematic top view of a touch display panel according to some exemplary embodiments of the present disclosure, in which touch electrodes and touch wires are schematically shown.
Figure 3:
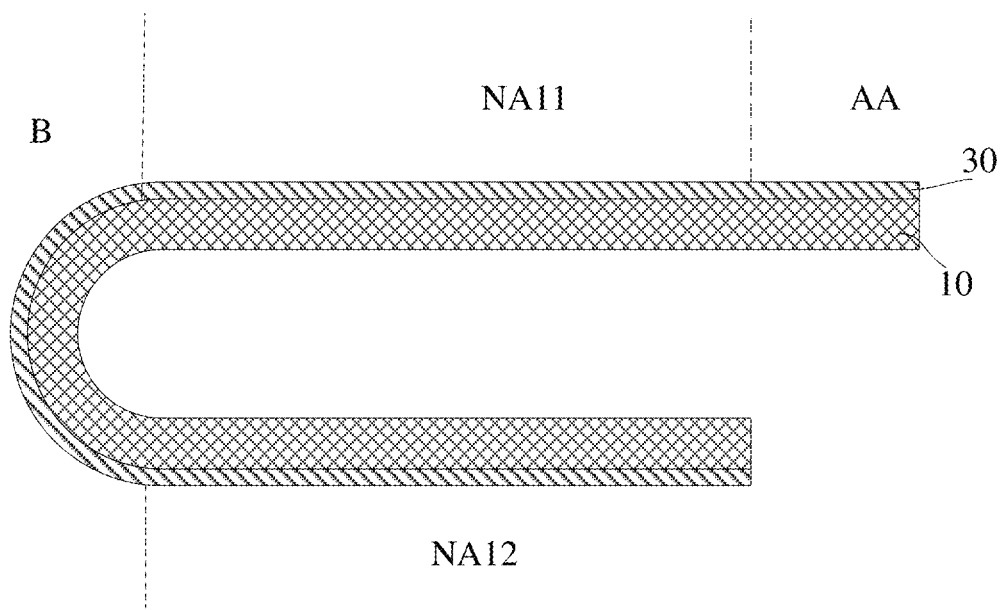
FIG. 3 shows a sectional view of the touch display panel taken along line AA' in FIG. 1 according to an embodiment of the present disclosure, in which a bending state of the touch display panel is schematically shown.
Figure 4:
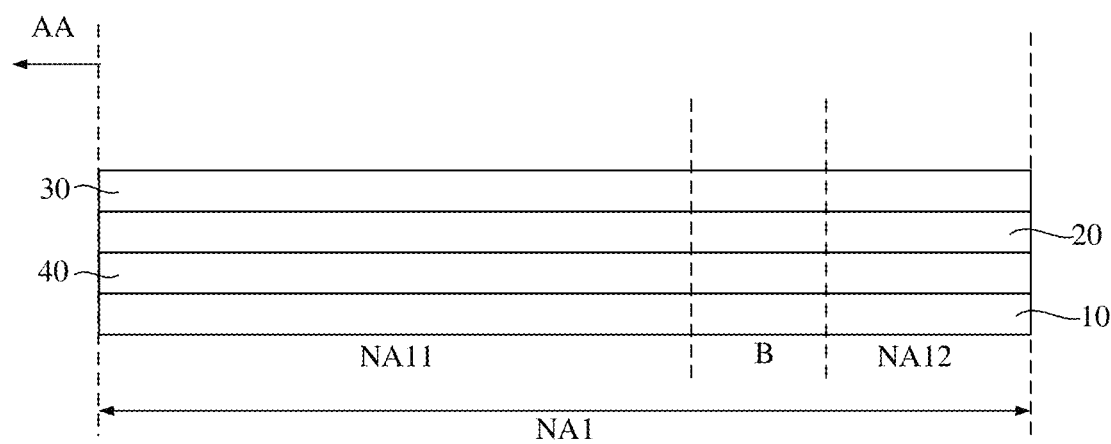
FIG. 4 shows a sectional view of the touch display panel taken along line BB' in FIG. 1 according to an embodiment of the present disclosure, in which an unfolded state of the touch display panel is schematically shown.
Figure 5:
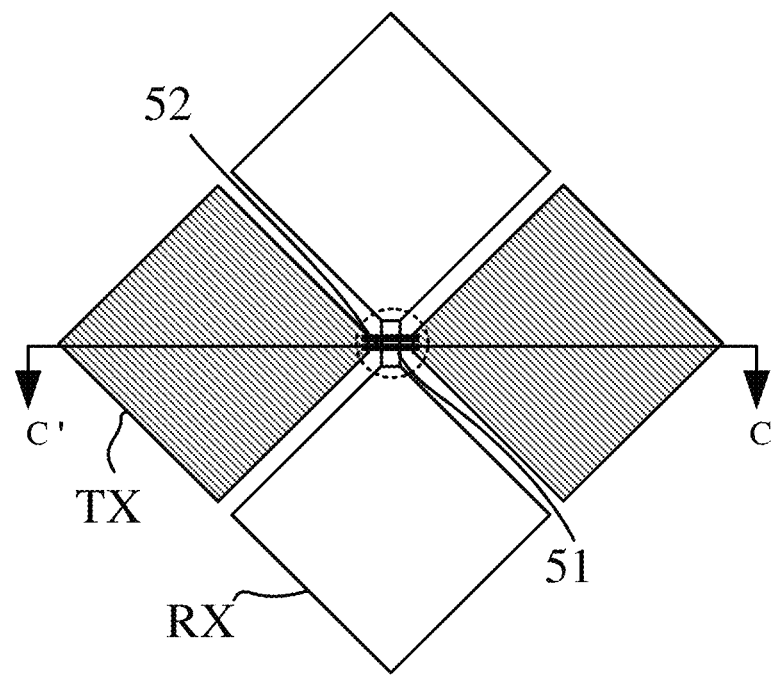
FIG. 5 shows a partially enlarged view of part I in FIG. 2.
Figure 6:
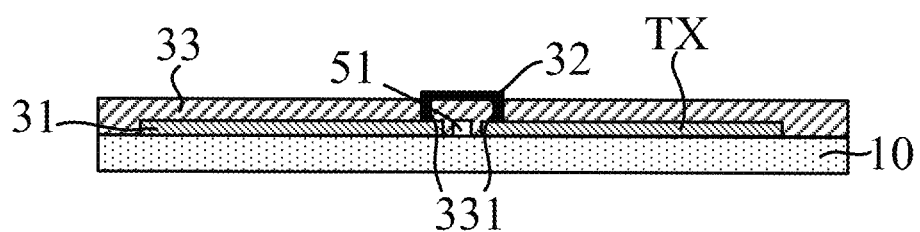
FIG. 6 shows a sectional view of the touch display panel taken along line CC' in FIG. 5 according to an embodiment of the present disclosure.
Figure 7:
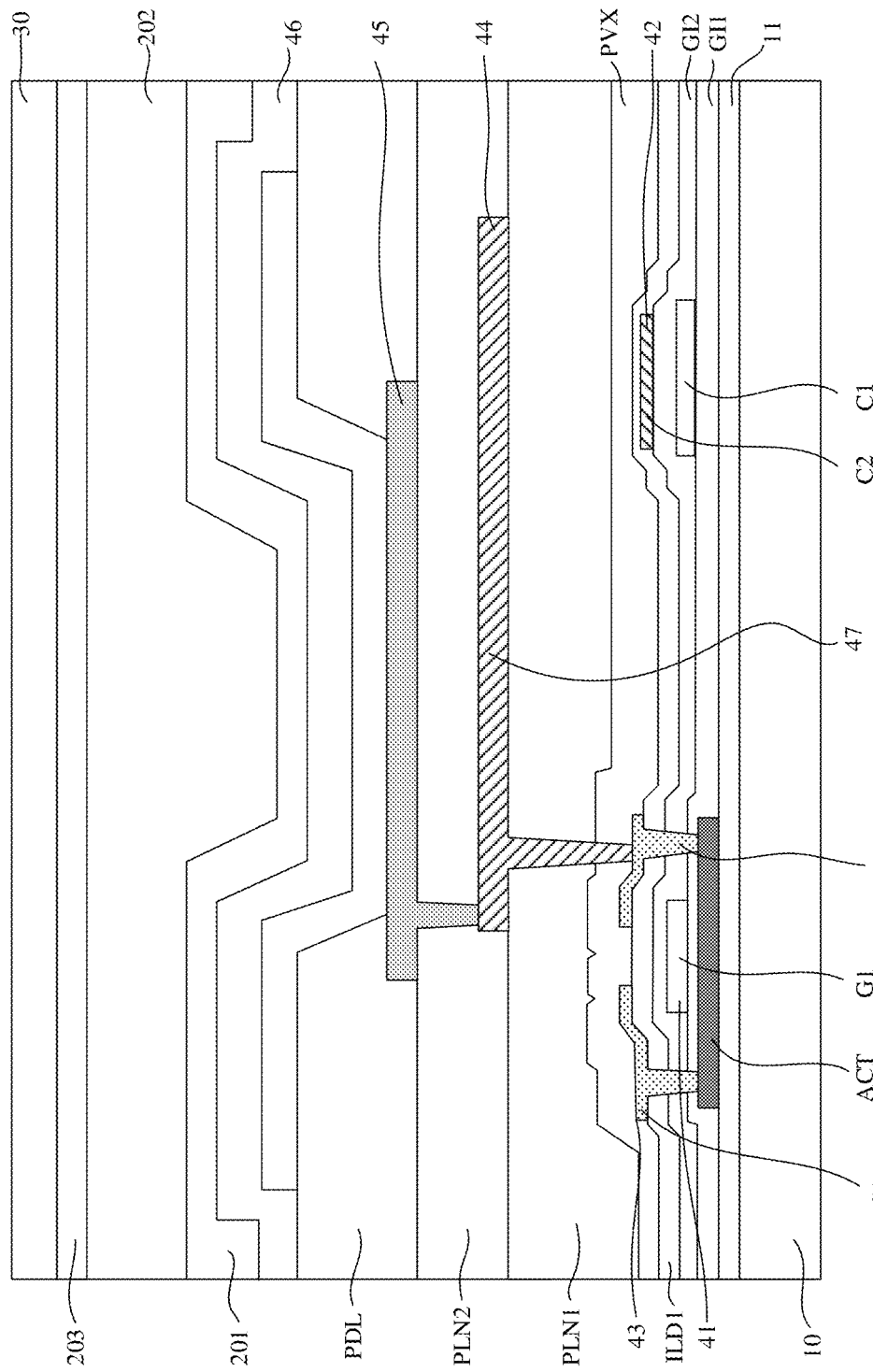
FIG. 7 shows a sectional view of the touch display panel taken along line DD' in FIG. 2 according to an embodiment of the present disclosure, in which a sectional structure of the touch display panel in a display area is schematically shown.

FIG. 1 shows a schematic top view of a touch display panel according to an embodiment of the present disclosure. FIG. 2 shows a schematic top view of a touch display panel according to some exemplary embodiments of the present disclosure, in which touch electrodes and touch wires are schematically shown. FIG. 3 shows a sectional view of the touch display panel taken along line AA' in FIG. 1 according to an embodiment of the present disclosure, in which a bending state of the touch display panel is schematically shown. FIG. 4 shows a sectional view of the touch display panel taken along line BB' in FIG. 1 according to an embodiment of the present disclosure, in which an unfolded state of the touch display panel is schematically shown. FIG. 5 shows a partially enlarged view of part I in FIG. 2. FIG. 6 shows a sectional view of the touch display panel taken along line CC' in FIG. 5 according to an embodiment of the present disclosure. FIG. 7 shows a sectional view of the touch display panel taken along line DD' in FIG. 2 according to an embodiment of the present disclosure, in which a sectional structure of the touch display panel in a display area is schematically shown.

Referring to FIG. 1, the touch display panel according to the embodiments of the present disclosure may include a base substrate 10. For example, the base substrate 10 may be formed of glass, plastic, polyimide, or other materials. The base substrate 10 includes a display area AA and a peripheral area (or referred to as a non-display area) NA on at least one side of the display area AA.

The touch display panel may include a plurality of pixel units P (schematically shown by a dashed box in FIG. 1) in the display area AA. The plurality of pixel units P may be arranged in an array in a direction X and a direction Y on the base substrate 10. Each of the pixel units P may include a plurality of sub-pixels, such as a red sub-pixel, a green sub-pixel, and a blue sub-pixel. One sub-pixel SP is schematically shown in FIG. 1.

For example, the touch display panel includes a signal input side IN1 (the lower side shown in FIG. 1). A data driver chip IC may be provided on the signal input side IN1. The data driver chip IC may be electrically connected to the pixel units P located in the display area through a plurality of signal lines, and the pixel driving circuits may be electrically connected to the data driver chip IC. In this way, signals such as data signals, scanning signals, touch signals, etc. may be transmitted from the signal input side IN1 to the plurality of pixel units P.

For example, as shown in FIG. 1, the peripheral area NA may be on four sides of the display area AA, that is, the peripheral area NA surrounds the display area AA.

It will be noted that in the accompanying drawings, a pixel unit and sub-pixels are schematically shown in rectangular shapes, but this does not constitute a limitation on the shapes of the pixel units and sub-pixels included in the touch display panel provided by the embodiments of the present disclosure.

In the embodiments of the present disclosure, each pixel unit P may include a pixel driving circuit and a light-emitting device electrically connected to the pixel driving circuit. For example, the light-emitting device may be an organic light-emitting diode (OLED) or a quantum dot light-emitting diode (QLED), etc. The light-emitting device may include a first electrode, a second electrode, and a light-emitting layer between the first electrode and the second electrode.

One of the first electrode and the second electrode is an anode electrode, and the other is a cathode electrode. For example, the first electrode may be the anode electrode, and the second electrode may be the cathode electrode. The light-emitting layer may have a multilayer structure, for example, it may include a multilayer structure including a hole injection layer, a hole transport layer, an organic light-emitting layer, an electron transport layer and an electron injection layer.

It will be noted that for example, an active drive or a passive drive may be applied to the light-emitting device of the organic light-emitting diode. An OLED array substrate adopting passive drive includes a cathode electrode and an anode electrode, an overlap of the anode electrode and the cathode electrode may emit light, and the driving circuit may be externally mounted by a connection method such as a tape carrier package or a chip-on-glass. Each pixel in an OLED array substrate adopting active drive may be provided with a pixel driving circuit. The pixel driving circuit may include a thin film transistor with a switching function (that is, a switching transistor), a thin film transistor with a driving function (that is, a driving transistor), and a charge storage capacitor. In addition, the pixel driving circuit may further include a thin film transistor of other type with a compensation function. It will be understood that, in the embodiments of the present disclosure, the touch display panel may be provided with various types of known pixel driving circuits, which will not be described in detail here. For example, each pixel unit P may include a pixel driving circuit having a circuit structure of 7T1C, 7T2C, 8T2C or 4T1C in the art. The pixel driving circuit may operate under the control of a data signal transmitted through a data line, and a gate scanning signal and a light-emission control signal transmitted through signal lines, so as to drive the light-emitting device to emit light, thereby achieving display and other operations.

For example, the touch display panel may include a driving circuit layer. The above-mentioned pixel driving circuit may be provided in the driving circuit layer. An insulating layer may be provided between the driving circuit layer and the light-emitting device. The insulating layer may be a single insulating film layer or a stacked layer including a plurality of insulating film layers.

For example, the touch display panel may further include various signal lines disposed on the base substrate 10. The various signal lines may include a data line, a gate scanning signal line, a light-emission control signal line, a first power wire, a second power wire, etc., so as to provide various signals such as a data signal, a gate scanning signal, a light-emission control signal, a first power supply voltage, a second power supply voltage, etc. to the pixel driving circuit in each sub-pixel. In the embodiments shown in FIG. 1, a scanning line GL and a data line DL are schematically shown. Scanning lines GL and data lines DL may be electrically connected to the respective pixel units P.

Referring to FIG. 1 to FIG. 3, the touch display panel according to the embodiments of the present disclosure includes a display area AA and a peripheral area NA surrounding the display area AA. The peripheral area NA includes a first frame area NA1, a second frame area NA2, a third frame area NA3, and a fourth frame area NA4. For example, the first frame area NA1, the second frame area NA2, the third frame area NA3 and the fourth frame area NA4 may be regarded as a lower frame, an upper frame, a left frame and a right frame of the touch display panel, respectively.

Viewed from the front of the touch display panel, the touch display panel according to the embodiments of the present disclosure includes the display area and the peripheral area. The display area of the touch display panel is provided with light-emitting pixels and may display images. The peripheral area surrounds the display area. Typically, the frame areas are located on four sides of the display area when viewed from the front. However, in some touch display panels, from an aesthetic perspective, it is desired that the frame area is as narrow as possible, and therefore, for example, in applications such as a frame-less mobile phone, no frame area is provided on the left, right and upper sides of the display area. Nevertheless, the touch display panel still needs at least one frame area to centrally accommodate circuits that are necessary but unable to be bent, and such frame area is generally located on a lower side the display area. For example, even in the implementation of a current frame-less mobile phone, there is still a lower frame area on a lower side of a mobile phone that does not display images. It will be understood that the terms "upper", "lower", "left", "right", "front", and "rear" herein are just used to describe relative positions between components rather than absolute positions. In the present disclosure, the lower frame is only for convenience in describing the relative position, but it does not mean that the lower frame is necessarily located on the lower side of a picture displayed. In addition, although a conventional touch display panel is rectangular and the lower frame area is a rectangular region on one of four sides of the touch display panel, a touch display panel with other outline shapes may also have a frame area of any shape in which circuits are centrally accommodated. Any frame with concentrated circuit wires in the touch display panel may be considered as the lower frame. When described in the present disclosure, it is stipulated that the lower frame is located on the lower side, and the display area is located on an upper side accordingly.

In the embodiments of the present disclosure, at least part of the first frame area NA1 may be bent to a non-display side of the touch display panel, so that an area of a non-display area on a display side of the touch display panel may be reduced, and a large screen and narrow-frame design of the touch display panel may be achieved. For example, the first frame area NA1 may include a first frame sub-region NA11, a second frame sub-region NA12, and a bending region B. The first frame sub-region NA11 is located on a side of the second frame sub-region NA12 close to the display area AA, and the bending region B is located between the first frame sub-region NA11 and the second frame sub-region NA12. The bending region B is bendable along a bending axis BX, so that the second frame sub-region NA12 may be bent to the non-display side of the touch display panel. For example, structures such as a driver chip (IC) and a flexible printed circuit (FPC) for controlling the display and touch control of the display area AA may be disposed in the second frame sub-region NA12.

Referring to FIG. 2 and FIG. 4, the touch display panel may include a base substrate 10, a driving circuit layer 40, an encapsulation layer 20, and a touch layer 30. The driving circuit layer 40, the encapsulation layer 20 and the touch layer 30 are sequentially arranged in a direction away from the base substrate 10.

For example, the touch layer 30 may include an FMLOC film layer. With the development of technology, the market has put forward increasingly higher requirements for the thinning of display devices (such as mobile phones), and Flexible Multi-Layer On Cell (FMLOC) technology has emerged. In the FMLOC process, the touch function is achieved by fabricating a metal grid electrode layer on the encapsulation layer of the display module, and no external touch structure is required, so that an overall thickness of the display screen may be reduced.

Referring to FIG. 2, FIG. 5 and FIG. 6, in the embodiments of the present disclosure, the touch layer 30 may include a first touch layer 31, a second touch layer 32, and a touch insulating layer 33 between the first touch layer 31 and the second touch layer 32. For example, in the display area AA, the touch display panel may include a first touch electrode TX and a second touch electrode RX. For example, the first touch electrode TX may be a touch driving electrode TX, and the second touch electrode RX may be a touch sensing electrode RX. A plurality of first touch electrodes TX may be arranged in the first direction X, and a plurality of second touch electrodes RX may be arranged in a second direction intersecting with the first direction. In some embodiments, the first direction is perpendicular to the second direction. For example, as shown in FIG. 2, the first direction may be a width direction of the touch display panel, and the second direction may be a length direction of the touch display panel.

More than one first touch electrode TX in a same row may be electrically connected through second connecting portions 52, and more than one second touch electrode RX in a same column may be electrically connected through first connecting portions 51.

As an example, in the example shown in FIG. 2 and FIG. 5, shapes of the first touch electrode TX and the second touch electrode RX are rhombus, and shapes of the first connecting portion 51 and the second connecting portion 52 are rectangle. However, the embodiments of the present disclosure are not limited thereto. Those skilled in the art will understand that in other embodiments, the shapes of the first touch electrode TX and the second touch electrode RX and the shapes of the first connecting portion 51 and the second connecting portion 52 may be other shapes.

An orthographic projection of the first connecting portion 51 for connecting the first touch electrodes TX on the base substrate at least partially overlaps with an orthographic projection of the second connecting portion 52 for connecting the second touch electrodes RX on the base substrate, that is, the first connecting portion 51 and the second connecting portion 52 have an overlapping region.

In the embodiments of the present disclosure, the first touch electrodes TX and the second touch electrodes RX may be in a same layer, for example, both of them are in the first touch layer 31. Also, the first connecting portion 51 may be in the first touch layer 31, and the second connecting portion 52 may be in the second touch layer 32. That is, the second connecting portion 52 forms a conductive bridging portion.

The touch insulating layer 33 is between the first touch layer 31 and the second touch layer 32, and covers the first touch electrodes TX and the second touch electrodes RX. At least a pair of first via holes 331 are provided in the touch insulating layer 33 and penetrate the touch insulating layer 33, so as to expose a partial region of the first touch electrode TX, which may be called as a bridging region. In each pair of first via holes 331, one via hole is located on one of two adjacent first touch electrodes TX, and the other via hole is located on the other one of the two adjacent first touch electrodes TX.

In some embodiments, part of the second connecting portion 52 is provided on a side of the touch insulating layer 33 away from the base substrate, and the rest is in the first via hole 331. An orthographic projection of the second connecting portion 52 on the base substrate at least partially overlaps with an orthographic projection of the at least one pair of first via holes 331 in the touch insulating layer 33 on the base substrate, so that the second connecting portion 52 may be electrically connected to the first touch electrodes TX through the first via holes 331 overlapping with the second connecting portion 52, thereby achieving an electrical connection between the adjacent first touch electrodes TX.

Referring to FIG. 2 and FIG. 7, in the display area AA, the touch display panel may include a base substrate 10, a buffer layer 11 on the base substrate 10, a semiconductor layer ACT on a side of the buffer layer 11 away from the base substrate 10, a first conductive layer 41 on a side of the semiconductor layer ACT away from the base substrate 10, a second conductive layer 42 on a side of the first conductive layer 41 away from the base substrate 10, a third conductive layer 43 on a side of the second conductive layer 42 away from the base substrate 10, and a fourth conductive layer 44 on a side of the third conductive layer 43 away from the base substrate 10. The touch display panel may further include a first insulating layer GI1 between the semiconductor layer ACT and the first conductive layer 41, a second insulating layer GI2 between the first conductive layer 41 and the second conductive layer 42, a third insulating layer ILD1 between the second conductive layer 42 and the third conductive layer 43, and a fourth insulating layer between the third conductive layer 43 and the fourth conductive layer 44. For example, the fourth insulating layer may include a passivation layer PVX and a first planarization layer PLN1. The passivation layer PVX may be provided on a side of the third conductive layer 42 away from the base substrate 10, and the first planarization layer PLN1 may be provided on a side of the passivation layer PVX away from the based substrate 10.

For example, the touch display panel may include a plurality of pixel units and pixel driving circuits for driving the plurality of pixel units. The pixel driving circuit may include a plurality of thin film transistors and a storage capacitor. The thin film transistor may include an active layer, a gate electrode, a source electrode, and a drain electrode. The storage capacitor may include a first electrode plate and a second electrode plate. One thin film transistor and one storage capacitor are schematically shown in FIG. 7. For example, the active layer of the thin film transistor may be located in the semiconductor layer ACT, the gate electrode G1 of the thin film transistor and the first electrode plate C1 of the storage capacitor may be located in the first conductive layer 41, the second electrode plate C2 of the storage capacitor may be located in the second conductive layer 42, and the source electrode S1 and the drain electrode D1 of the thin film transistor may be located in the third conductive layer 43.

In the display area AA, the touch display panel may further include a fifth conductive layer 45 on a side of the fourth conductive layer 44 away from the base substrate 10, a light-emitting material layer EL on a side of the fifth conductive layer 45 away from the base substrate 10, and a sixth conductive layer 46 on a side of the light-emitting material layer EL away from the base substrate 10. The touch display panel may further include a second planarization layer PLN2 between the fourth conductive layer 44 and the fifth conductive layer 45.

For example, the pixel unit may include a light-emitting element, such as an organic light-emitting diode. The light-emitting element includes an anode electrode, a light-emitting layer, and a cathode electrode. The anode electrode of the light-emitting element may be located in the fifth conductive layer 45, the light-emitting layer of the light-emitting element may be located in the light-emitting material layer EL, and the cathode electrode of the light-emitting element may be located in the sixth conductive layer 46. A conductive connecting portion 47 for electrically connecting the thin film transistor and the light-emitting element may be located in the fourth conductive layer 44.

For example, the touch display panel may further include a pixel defining layer PDL. The pixel defining layer PDL is located on a side of the fifth conductive layer 45 away from the base substrate 10 and is used to define an opening of each pixel unit.

For example, the semiconductor layer ACT may be formed of a semiconductor material such as low-temperature poly-silicon, and may have a film layer thickness in a range of 400 angstroms to 800 angstroms, such as 500 angstroms. The first conductive layer 41 and the second conductive layer 42 may be formed of a conductive material that forms the gate electrode of the thin film transistor, for example, the conductive material may be Mo. The first conductive layer 21 and the second conductive layer 22 may have a film layer thickness in a range of 2000 angstroms to 4000 angstroms, such as 3000 angstroms. The third conductive layer 43 and the fourth conductive layer 44 may be formed of a conductive material that forms the source electrode and the drain electrode of the thin film transistor, for example, the conductive material may include Ti, Al, etc. The third conductive layer 43 may have a stacked structure formed of Ti/Al/Ti, and may have a film layer thickness in a range of 6000 angstroms to 9000 angstroms. For example, in a case that the third conductive layer 43 or the fourth conductive layer 44 has a stacked structure formed of Ti/Al/Ti, the layers in the Ti/Al/Ti structure may have a thickness of about 500 angstroms, 6000 angstroms and 500 angstroms, respectively. For example, the first insulating layer GI1 and the second insulating layer GI2 may be formed of silicon oxide, silicon nitride, or silicon oxynitride, where each layer may have a thickness in a range of about 1000 angstroms to 2000 angstroms. For example, the third insulating layer IDL1 and the passivation layer PVX may be formed of silicon oxide, silicon nitride, or silicon oxynitride, and may have a thickness in a range of about 3000 angstroms to 6000 angstroms.

The touch display panel may further include an encapsulation layer 20 covering the light-emitting elements. The encapsulation layer 20 may include film layers formed of alternately arranged inorganic layer(s) and organic layer(s). For example, the encapsulation layer 20 may include a first encapsulation sub-layer 201, a second encapsulation sub-layer 202 and a third encapsulation sub-layer 203 that are arranged in sequence. For example, the first encapsulation sub-layer 201 and the third encapsulation sub-layer 203 may be formed of an inorganic material, and the second encapsulation sub-layer 202 may be formed of an organic material. For example, the first encapsulation sub-layer 201 and the third encapsulation sub-layer 203 may be formed by using chemical vapor deposition (i.e., CVD) and other processes, and the second encapsulation sub-layer 202 may be formed by inkjet printing (i.e., IJP) and other processes.

In the embodiments of the present disclosure, the touch layer 30 is formed on a side of the second encapsulation sub-layer 202 away from the base substrate 10.

Figure 14A:
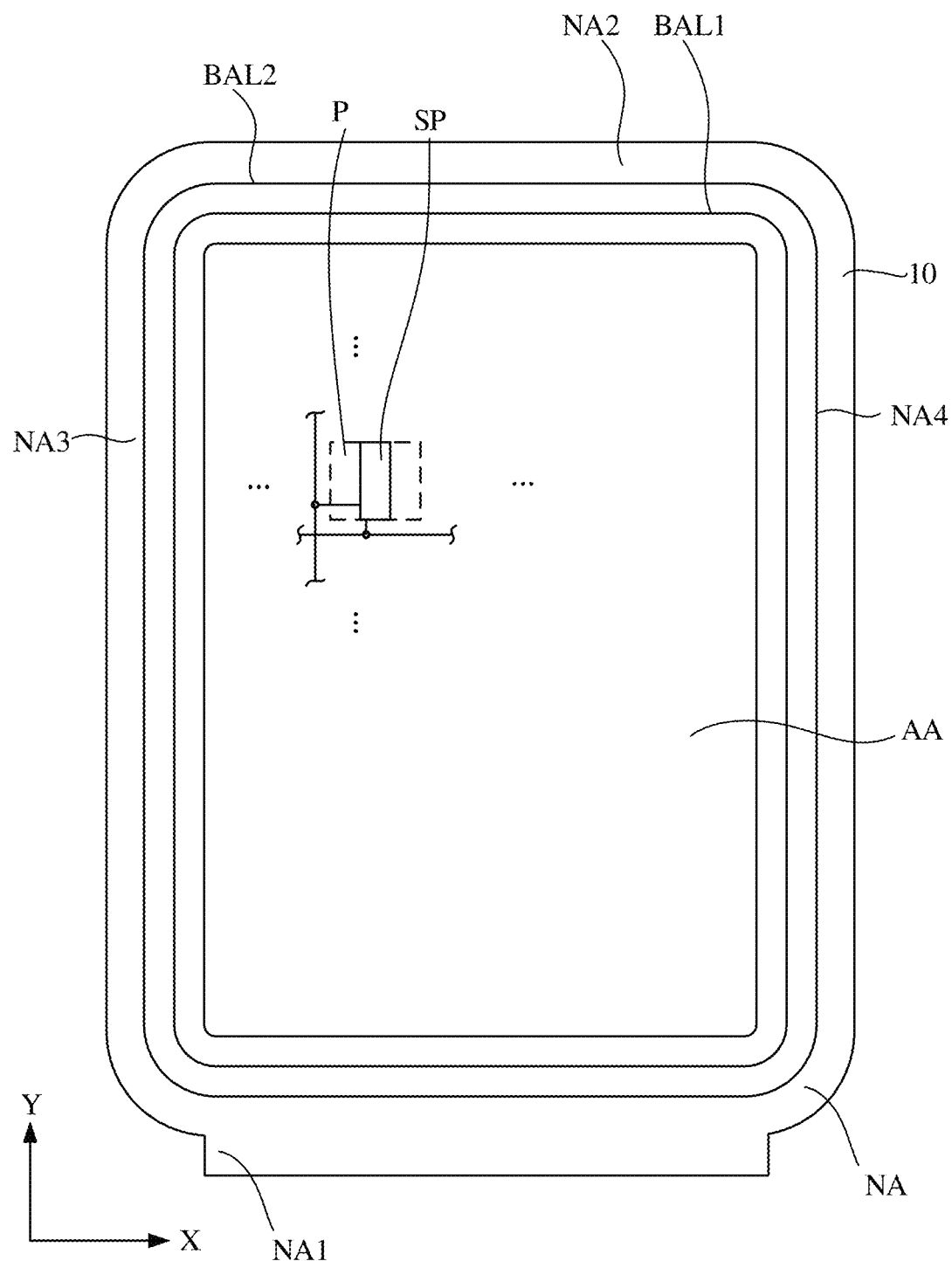
FIG. 14A shows a schematic top view of a touch display panel according to an embodiment of the present disclosure, in which a layout of a barrier dam located in a peripheral area on four sides of the touch display panel is schematically shown.
Figure 14B:
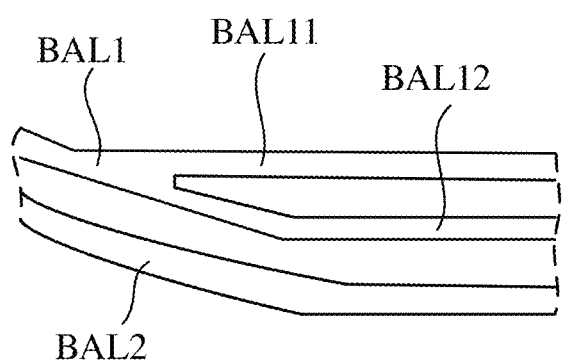
FIG. 14B schematically shows a layout of a barrier dam located in a peripheral area on a lower side of a touch display panel.

FIG. 14A shows a schematic top view of a touch display panel according to the embodiments of the present disclosure, in which a layout of a barrier dam located in a peripheral area on four sides of the touch display panel is schematically shown. FIG. 14B schematically shows a layout of a barrier dam located in a peripheral area on a lower side of a touch display panel.

Referring to FIG. 14A and FIG. 14B, in the embodiments of the present disclosure, the second encapsulation sub-layer 202 has a certain degree of fluidity in a manufacturing process. In order to restrict an overflow of the second encapsulation sub-layer 202, the touch display panel may further include a barrier dam between the display area AA and at least one peripheral area. In the embodiments of the present disclosure, the contact groove 80 is provided between the barrier dam and the bending region B.

In some embodiments, the barrier dam includes at least a loop of a structure that at least partially surrounds the display area AA, and the barrier dam includes at least one organic layer. For example, referring to FIG. 14A, the barrier dam may include two loops, namely a first barrier dam BAL1 and a second barrier dam BAL2. Each of the first barrier dam BAL1 and the second barrier dam BAL2 at least partially surrounds (for example, completely surrounds) the display area AA. Referring to FIG. 14B, in a lower region of the display panel, the barrier dam BAL1 may be branched into two barrier sub-dams, including a first barrier sub-dam BAL11 and a second barrier sub-dam BAL12. For example, in the embodiments shown in FIG. 14B, on the upper side, left side and right side of the display panel, the barrier dam still has two loops of structures surrounding the display area AA as shown in FIG. 14A. That is, the barrier dam BAL1 may be branched into two barrier sub-dams only in the lower region of the display panel.

Figure 15A:
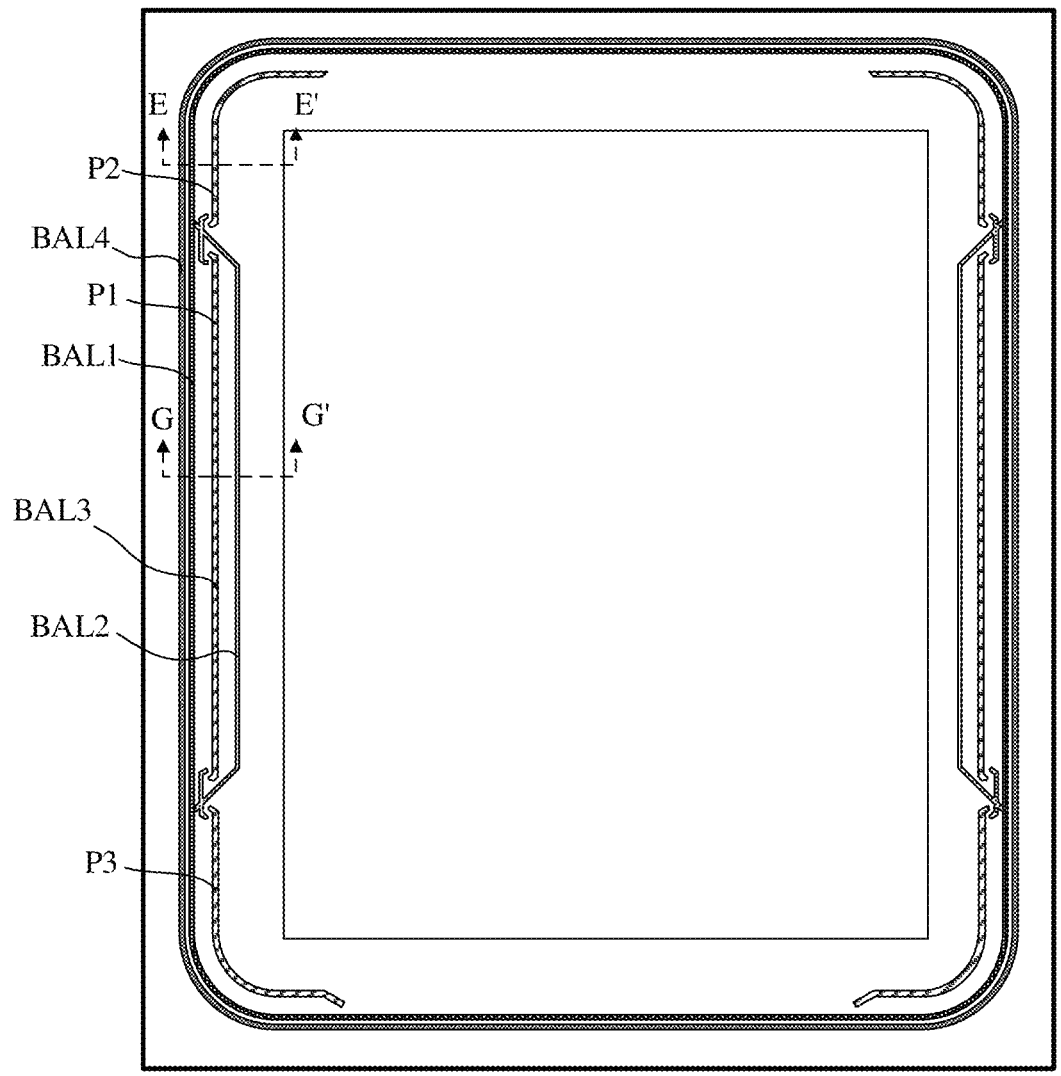
FIG. 15A shows a schematic top view of a touch display panel according to some other embodiments of the present disclosure, in which a layout of a barrier dam located in a peripheral area on four sides of the touch display panel is schematically shown.

FIG. 15A shows a schematic top view of the touch display panel according to other embodiments of the present disclosure, in which a layout of a barrier dam located in a peripheral area on four sides of the touch display panel is schematically shown.

Referring to FIG. 15A, the first barrier dam BAL1 forms a first enclosure structure surrounding a first region. The first region surrounds the display area AA. For example, the first region may include the display area and part of the peripheral area NA.

In some embodiments, the touch display panel further includes a second barrier dam BAL2 in the peripheral area NA. The second barrier dam BAL2 is connected to the first barrier dam BAL1 and divides the first region into a first sub-region completely in the peripheral area NA and a second sub-region partially in the peripheral area NA and partially in the display area AA. The second barrier dam BAL2 and part of the first barrier dam BAL1 surround the first sub-region. Optionally, as shown in FIG. 15A, the second sub-region surrounds the entire display area AA, and the first sub-region is completely outside the display area AA.

In some embodiments, the display panel further includes a third barrier dam BAL3 in the peripheral area NA. In some embodiments, the third barrier dam BAL3 includes at least a first portion P1. As shown in FIG. 15A, the first portion P1 is completely enclosed in the first sub-region. The first portion P1 is spaced apart from the second barrier dam BAL2 and spaced apart from the first barrier dam BAL1. Optionally, a body portion of the first portion P1 extends in a direction substantially parallel to an extension direction of a body portion of the second barrier dam BAL2 and substantially parallel to an extension direction of a portion of the first barrier dam BAL1 which partially surrounds the first sub-region. The first barrier dam BAL1, the first portion P1 of the third barrier dam, and the second barrier dam BAL2 form a triple barrier structure in the first sub-region. The triple barrier structure effectively prevents an overflow of ink (for example, ink used to form the organic encapsulation sub-layer of the encapsulation layer) printed on the display panel during the manufacturing process of the display panel.

Figure 15B:
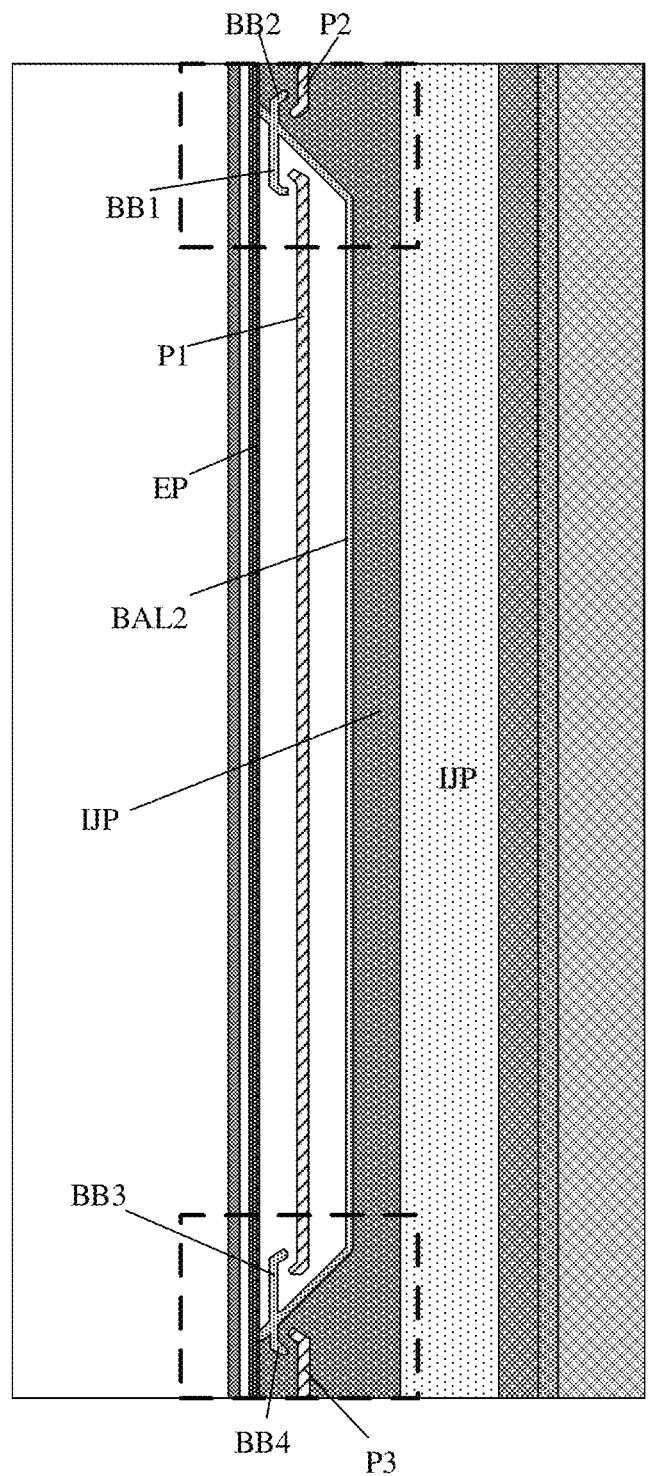
FIG. 15B shows an enlarged view of a region surrounding a second barrier dam in a display panel according to some embodiments of the present disclosure.
Figure 15C:
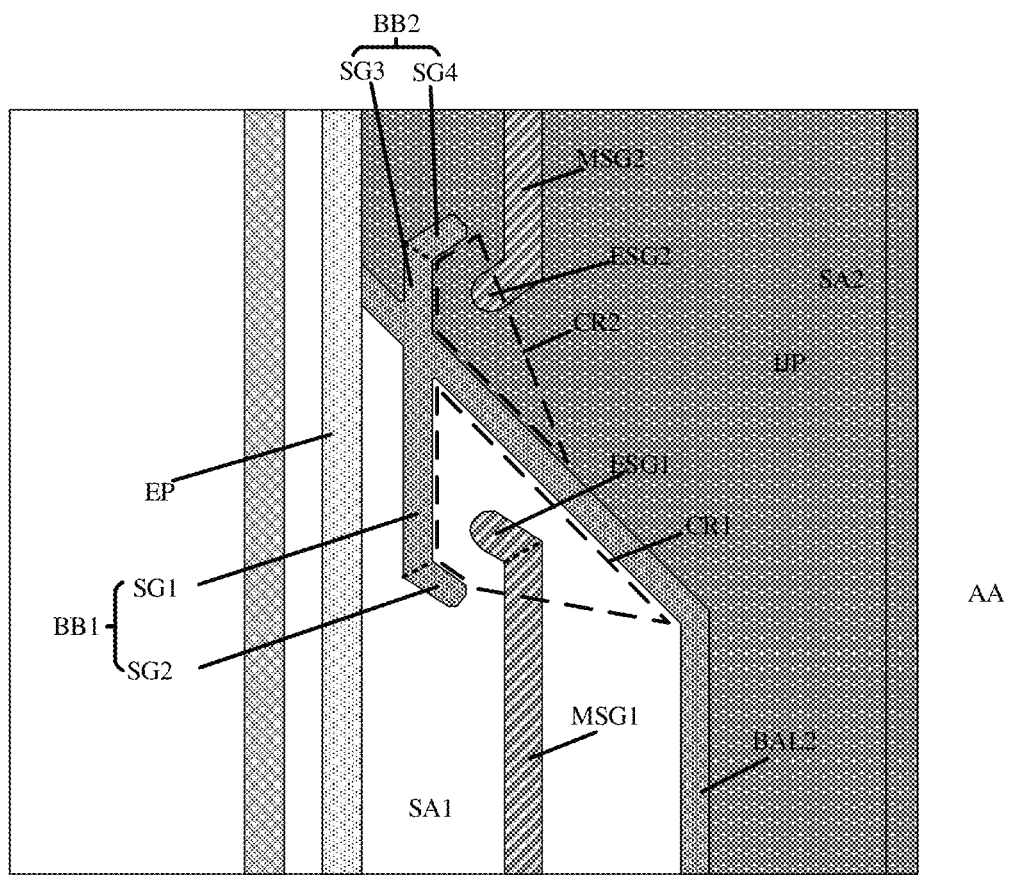
FIG. 15C shows an enlarged view of a first enlarged region in FIG. 15B.

FIG. 15B shows an enlarged view of a region surrounding a second barrier dam in a display panel according to some embodiments of the present disclosure. FIG. 15C shows an enlarged view of a first enlarged region in FIG. 15B. Referring to FIG. 15B and FIG. 15C, in some embodiments, the display panel further includes a first branch barrier portion BB1 in the first sub-region, and the first branch barrier portion BB1 is connected to the second barrier dam BAL2. The first branch barrier portion BB1 branches from the second barrier dam BAL2. The first branch barrier portion BB1 at least initially branches from the second barrier dam BAL2 in a direction substantially parallel to an extension direction of an enclosure portion EP of the first barrier dam.

In some embodiments, the first portion P1 includes a first end segment ESG1. The first end segment ESG1 at least partially extends into a first corner region CR1 between the first branch barrier portion BB1 and a part of the second barrier dam BAL2. The above-mentioned part of the second barrier dam BAL2 is inclined with respect to the enclosure portion EP of the first barrier dam.

In some embodiments, the first branch barrier portion BB1 includes at least a first segment SG1 and a second segment SG2. Optionally, the second segment SG2 is indirectly connected to the second barrier dam BAL2. In an example, the second segment SG2 is connected to the second barrier dam BAL2 through at least the first segment SG1. The first segment SG1 connects the second segment SG2 to the second barrier dam BAL2.

In some embodiments, in the top view of the display panel, the second segment SG2 extends in a direction more towards the display area AA than a direction in which the first segment SG1 extends. In an example, the first segment SG1 and the second segment SG2 are line segments, and an included angle between the first segment SG1 and the second segment SG2 is in a range of 95 degrees to 175 degrees, for example, in a range of 95 degrees to 105 degrees, 105 degrees to 115 degrees, 115 degrees to 125 degrees, 125 degrees to 135 degrees, 135 degrees to 145 degrees, 145 degrees to 155 degrees, 155 degrees to 165 degrees, or 165 degrees to 175 degrees. Optionally, the included angle between the first segment SG1 and the second segment SG2 ranges from 130 degrees to 140 degrees (e.g., 135 degrees).

In some embodiments, the first portion P1 further includes a first body segment MSG1 connected to the first end segment ESG1. The first body segment MSG1 is at least partially outside the first corner region CR1.

In some embodiments, in the top view of the display panel, the first end segment ESG1 extends in a direction more away from the display area AA than a direction in which the first body segment MSG1 extends. In an example, the first end segment ESG1 and the first body segment MSG1 are line segments, and an included angle between the first end segment ESG1 and the first body segment MSG1 is in a range of 95 degrees to 175 degrees, for example, in a range of 95 degrees to 105 degrees, 105 degrees to 115 degrees, 115 degrees to 125 degrees, 125 degrees to 135 degrees, 135 degrees to 145 degrees, 145 degrees to 155 degrees, 155 degrees to 165 degrees, or 165 degrees to 175 degrees. Optionally, the included angle between the first end segment ESG1 and the first body segment MSG1 ranges from 130 degrees to 140 degrees, such as 135 degrees.

In some embodiments, in the top view of the display panel, the second segment SG2 extends in a direction more towards the first body segment MSG1 than a direction in which the first segment SG1 extends; in the top view of the display panel, the first end segment ESG1 extends in a direction more towards the first segment SG1 than a direction in which the first body segment MSG1 extends. Optionally, the extension direction of the first segment SG1 and the extension direction of the first body segment MSG1 are substantially parallel. Optionally, the extension direction of the second segment SG2 and the extension direction of the first end segment ESG1 are substantially parallel.

In some embodiments, the third barrier dam BAL3 further includes a second portion P2 partially surrounding the display area AA. The first portion P1 and the second portion P2 are separated by the second barrier dam BAL2. The second portion P2 is spaced apart from the second barrier dam BAL2.

In some embodiments, the display panel further includes a second branch barrier portion BB2 in the first sub-region, and the second branch barrier portion BB2 is connected to the second barrier dam BAL2. The second branch barrier portion BB2 branches from the second barrier dam BAL2. The second branch barrier BB2 at least initially branches from the second barrier dam BAL2 in a direction substantially parallel to the extension direction of the enclosure portion EP of the first barrier dam.

In some embodiments, the second portion P2 includes a second end segment ESG2. The second end segment ESG2 at least partially extends into a second corner region CR2 between the second branch barrier portion BB2 and a part of the second barrier dam BAL2. The above-mentioned part of the second barrier dam BAL2 is inclined with respect to the enclosure portion EP of the first barrier dam.

In some embodiments, the second branch barrier portion BB2 includes at least a third segment SG3 and a fourth segment SG4. Optionally, the fourth segment SG4 is indirectly connected to the second barrier dam BAL2. In an example, the fourth segment SG4 is connected to the second barrier dam BAL2 at least through the third segment SG3. The third segment SG3 connects the fourth segment SG4 to the second barrier dam BAL2.

In some embodiments, in the top view of the display panel, the fourth segment SG4 extends in a direction more towards the display area AA than a direction in which the third segment SG3 extends. In an example, the third segment SG3 and the fourth segment SG4 are line segments, and an included angle between the third segment SG3 and the fourth segment SG4 is in a range of 95 degrees to 175 degrees, for example, in a range of 95 degrees to 105 degrees, 105 degrees to 115 degrees, 115 degrees to 125 degrees, 125 degrees to 135 degrees, 135 degrees to 145 degrees, 145 degrees to 155 degrees, 155 degrees to 165 degrees, or 165 degrees to 175 degrees. Optionally, the included angle between the third segment SG3 and the fourth segment SG4 ranges from 130 degrees to 140 degrees, such as 135 degrees.

In some embodiments, the second portion P2 further includes a second body segment MSG2 connected to the second end segment ESG2. The second body segment MSG2 is at least partially outside the second corner region CR2.

In some embodiments, in the top view of the display panel, the second end segment ESG2 extends in a direction more away from the display area AA than a direction in which the second body segment MSG2 extends. In an example, the second end segment ESG2 and the second body segment MSG2 are line segments, and an included angle between the second end segment ESG2 and the second body segment MSG2 is in a range of 95 degrees to 175 degrees, for example, in a range of 95 degrees to 105 degrees, 105 degrees to 115 degrees, 115 degrees to 125 degrees, 125 degrees to 135 degrees, 135 degrees to 145 degrees, 145 degrees to 155 degrees, 155 degrees to 165 degrees, or 165 degrees to 175 degrees. Optionally, the included angle between the second end segment ESG2 and the second body segment MSG2 ranges from 130 degrees to 140 degrees, such as 135 degrees.

In some embodiments, in the top view of the display panel, the fourth segment SG4 extends in a direction more towards the second body segment MSG2 than a direction in which third segment SG3 extends; in the top view of the display panel, the second end segment ESG2 extends in a direction more towards the third segment SG3 than a direction in which the second body segment MSG2 extends. Optionally, the extension direction of the third segment SG3 and the extension direction of the second body segment MSG2 are substantially parallel. Optionally, the extension direction of the fourth segment SG4 and the extension direction of the second end segment ESG2 are substantially parallel.

In some embodiments, the third barrier dam BAL3 further includes a third portion P3 partially surrounding the display area AA. The first portion P1 and the third portion P3 are separated by the second barrier dam BAL2. The third portion P3 is located in the second sub-region and outside the first sub-region. The third portion P3 is spaced apart from the second barrier dam BAL2.

Figure 15D:
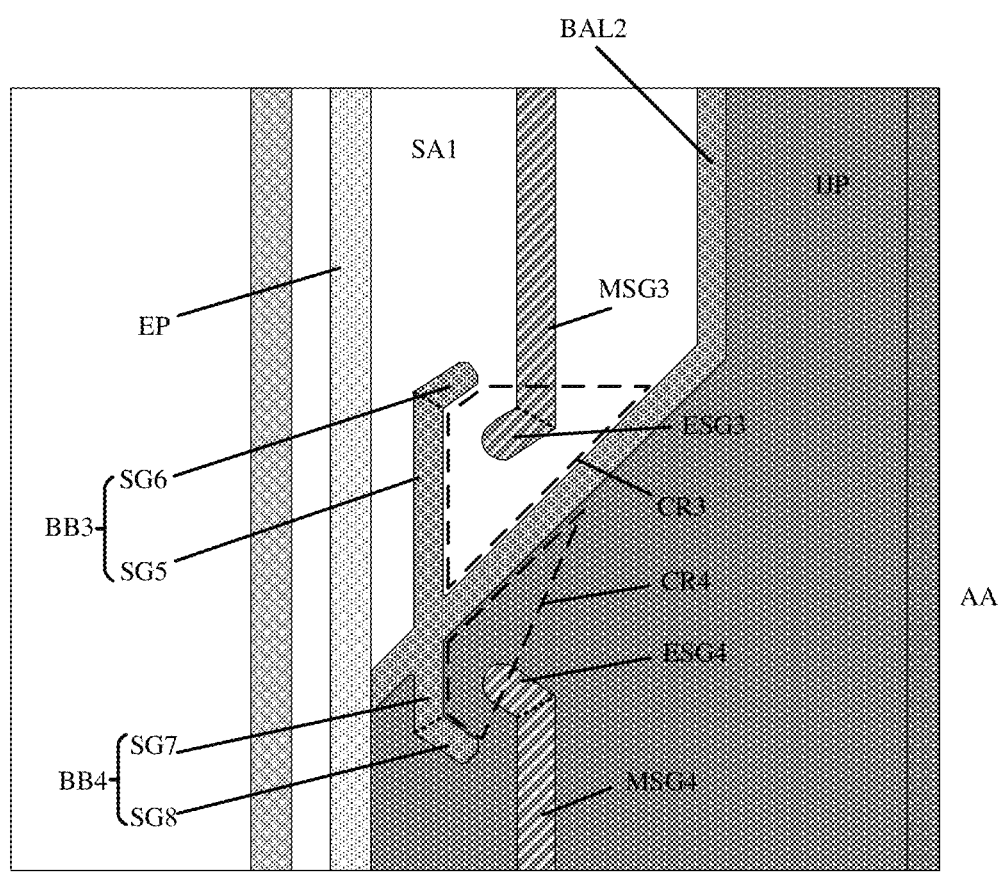
FIG. 15D shows an enlarged view of a second enlarged region in FIG. 15B.

FIG. 15D shows an enlarged view of a second enlarged region in FIG. 15B. Referring to FIG. 15B and FIG. 15D, in some embodiments, the display panel further includes a third branch barrier portion BB3 in the first sub-region, and the third branch barrier portion BB3 is connected to the second barrier dam BAL2. The third branch barrier portion BB3 branches from the second barrier dam BAL2. The third branch barrier BB3 at least initially branches from the second barrier dam BAL2 in a direction substantially parallel to the extension direction of the enclosure portion EP of the first barrier dam.

In some embodiments, the first portion P1 further includes a third end segment ESG3. The third end segment ESG3 at least partially extends into a third corner region CR3 between the third branch barrier portion BB3 and a part of the second barrier dam BAL2. The above-mentioned part of the second barrier dam BAL2 is inclined with respect to the enclosure portion EP of the first barrier dam.

In some embodiments, the third branch barrier portion BB3 includes at least a fifth segment SG5 and a sixth segment SG6. Optionally, the sixth segment SG6 is indirectly connected to the second barrier dam BAL2. In an example, the sixth segment SG6 is connected to the second barrier dam BAL2 at least through the fifth segment SG5. The fifth segment SG5 connects the sixth segment SG6 to the second barrier dam BAL2.

In some embodiments, in the top view of the display panel, the sixth segment SG6 extends in a direction more towards the display area AA than a direction in which the fifth segment SG5 extends. In an example, the fifth segment SG5 and the sixth segment SG6 are line segments, and an included angle between the fifth segment SG5 and the sixth segment SG6 is in a range of 95 degrees to 175 degrees, for example, in a range of 95 degrees to 105 degrees, 105 degrees to 115 degrees, 115 degrees to 125 degrees, 125 degrees to 135 degrees, 135 degrees to 145 degrees, 145 degrees to 155 degrees, 155 degrees to 165 degrees, or 165 degrees to 175 degrees. Optionally, the included angle between the fifth segment SG5 and the sixth segment SG6 range from 130 degrees to 140 degrees, such as 135 degrees.

In some embodiments, the first portion P1 further includes a third body segment MSG3 connected to the third end segment ESG3. The third body segment MSG3 is at least partially outside the third corner region CR3. Optionally, the first body segment MSG1 and the third body segment MSG3 are part of an overall structure of the first portion P1. Optionally, the first body segment MSG1 and the third body segment MSG3 are collinear segments of the first portion P1. Optionally, the first body segment MSG1 and the third body segment MSG3 form a linear portion of the first portion P1, and the first end segment ESG1 and the third end segment ESG3 are respectively connected to the linear portion at opposite ends of the linear portion.

In some embodiments, in the top view of the display panel, the third end segment ESG3 extends in a direction more away from the display area AA than a direction in which the third body segment MSG3 extends. In an example, the third end segment ESG3 and the third main body segment MSG3 are line segments, and an included angle between the third end segment ESG3 and the third body segment MSG3 is in a range of 95 degrees to 175 degrees, for example, in a range of 95 degrees to 105 degrees, 105 degrees to 115 degrees, 115 degrees to 125 degrees, 125 degrees to 135 degrees, 135 degrees to 145 degrees, 145 degrees to 155 degrees, 155 degrees to 165 degrees, or 165 degrees to 175 degrees. Optionally, the included angle between the third end segment ESG3 and the third body segment MSG3 ranges from 130 degrees to 140 degrees, such as 135 degrees.

In some embodiments, in the top view of the display panel, the sixth segment SG6 extends in a direction more towards the third body segment MSG3 than a direction in which the fifth segment SG5 extends; in the top view of the display panel, the third end segment ESG3 extends in a direction more towards the fifth segment SG5 than a direction in which the third body segment MSG3 extends. Optionally, the extension direction of the fifth segment SG5 and the extension direction of the third body segment MSG3 are substantially parallel. Optionally, the extension direction of the sixth segment SG6 and the extension direction of the third end segment ESG3 are substantially parallel.

In some embodiments, the display panel further includes a fourth branch barrier portion BB4 in the first sub-region SA1, and the fourth branch barrier portion BB4 is connected to the second barrier dam BAL2. The fourth branch barrier portion BB4 branches from the second barrier dam BAL2. The fourth branch barrier portion BB4 at least initially branches from the second barrier dam BAL2 in a direction substantially parallel to the extension direction of the enclosure portion EP of the first barrier dam.

In some embodiments, the third portion P3 includes a fourth end segment ESG4. The fourth end segment ESG4 at least partially extends into a fourth corner region CR4 between the fourth branch barrier portion BB4 and a part of the second barrier dam BAL2. The above-mentioned part of the second barrier dam BAL2 is inclined with respect to the enclosure portion EP of the first barrier dam.

In some embodiments, the fourth branch barrier portion BB4 includes at least a seventh segment SG7 and an eighth segment SG8. Optionally, the eighth segment SG8 is indirectly connected to the second barrier dam BAL2. In an example, the eighth segment SG8 is connected to the second barrier dam BAL2 at least through the seventh segment SG7. The seventh segment SG7 connects the eighth segment SG8 to the second barrier dam BAL2.

In some embodiments, in the top view of the display panel, the eighth segment SG8 extends in a direction more towards the display area AA than a direction in which the seventh segment SG7 extends. In an example, the seventh segment SG7 and the eighth segment SG8 are line segments, and an included angle between the seventh segment SG7 and the eighth segment SG8 is in a range of 95 degrees to 175 degrees, for example, in a range of 95 degrees to 105 degrees, 105 degrees to 115 degrees, 115 degrees to 125 degrees, 125 degrees to 135 degrees, 135 degrees to 145 degrees, 145 degrees to 155 degrees, 155 degrees to 165 degrees, or 165 degrees to 175 degrees. Optionally, the included angle between the seventh segment SG7 and the eighth segment SG8 ranges from 130 degrees to 140 degrees, such as 135 degrees.

In some embodiments, the third portion P3 further includes a fourth body segment MSG4 connected to the fourth end segment ESG4. The fourth body segment MSG4 is at least partially outside the fourth corner region CR4.

In some embodiments, in the top view of the display panel, the fourth end segment ESG4 extends in a direction more away from the display area AA than a direction in which the fourth body segment MSG4 extends. In an example, the fourth end segment ESG4 and the fourth body segment MSG4 are line segments, and an included angle between the fourth end segment ESG4 and the fourth body segment MSG4 is in a range of 95 degrees to 175 degrees, for example, in a range of 95 degrees to 105 degrees, 105 degrees to 115 degrees, 115 degrees to 125 degrees, 125 degrees to 135 degrees, 135 degrees to 145 degrees, 145 degrees to 155 degrees, 155 degrees to 165 degrees, or 165 degrees to 175 degrees. Optionally, the included angle between the fourth end segment ESG4 and the fourth body segment MSG4 ranges from 130 degrees to 140 degrees, such as 135 degrees.

In some embodiments, in the top view of the display panel, the eighth segment SG8 extends in a direction more towards the fourth body segment MSG4 than a direction in which the seventh segment SG7 extends; in the top view of the display panel, the fourth end segment ESG4 extends in a direction more towards the seventh segment SG7 than a direction in which the fourth body segment MSG4 extends. Optionally, the extension direction of the seventh segment SG7 and the extension direction of the fourth body segment MSG4 are substantially parallel. Optionally, the extension direction of the eighth segment SG8 and the extension direction of the fourth end segment ESG4 are substantially parallel.

Figure 15E:
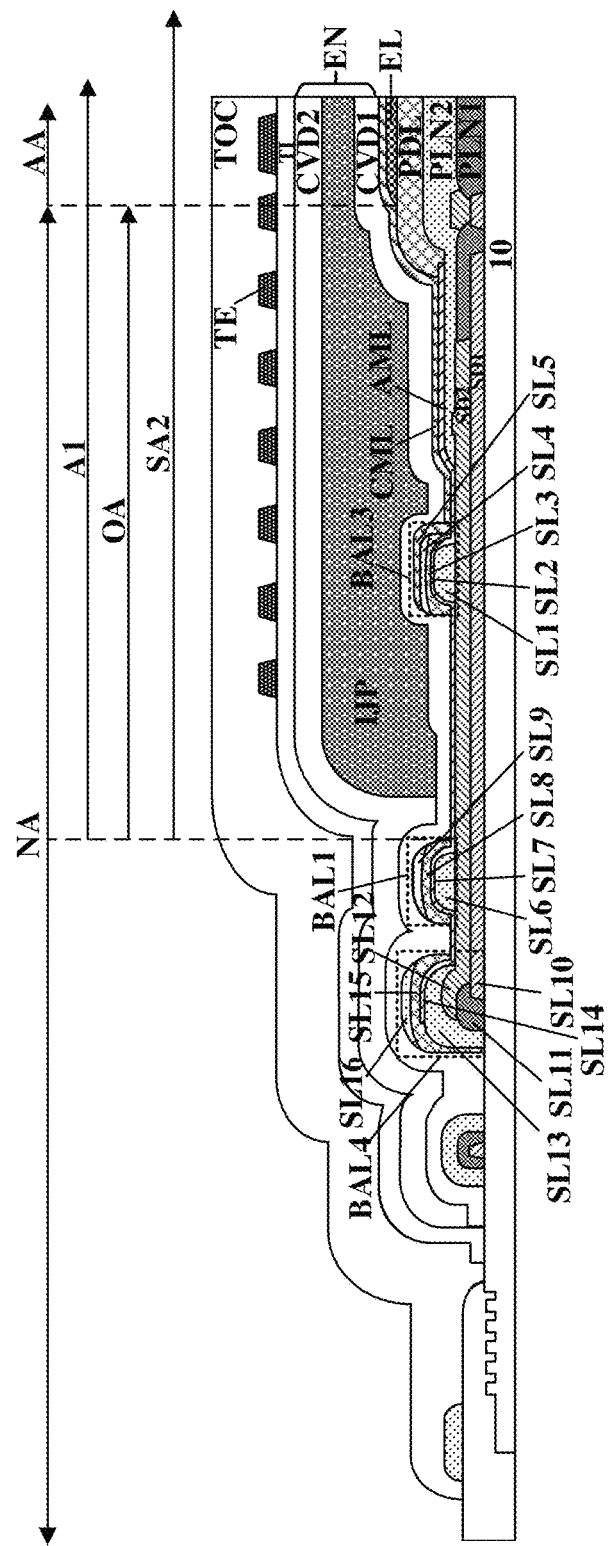
FIG. 15E shows a sectional view taken along line EE' in FIG. 15A.
Figure 15F:
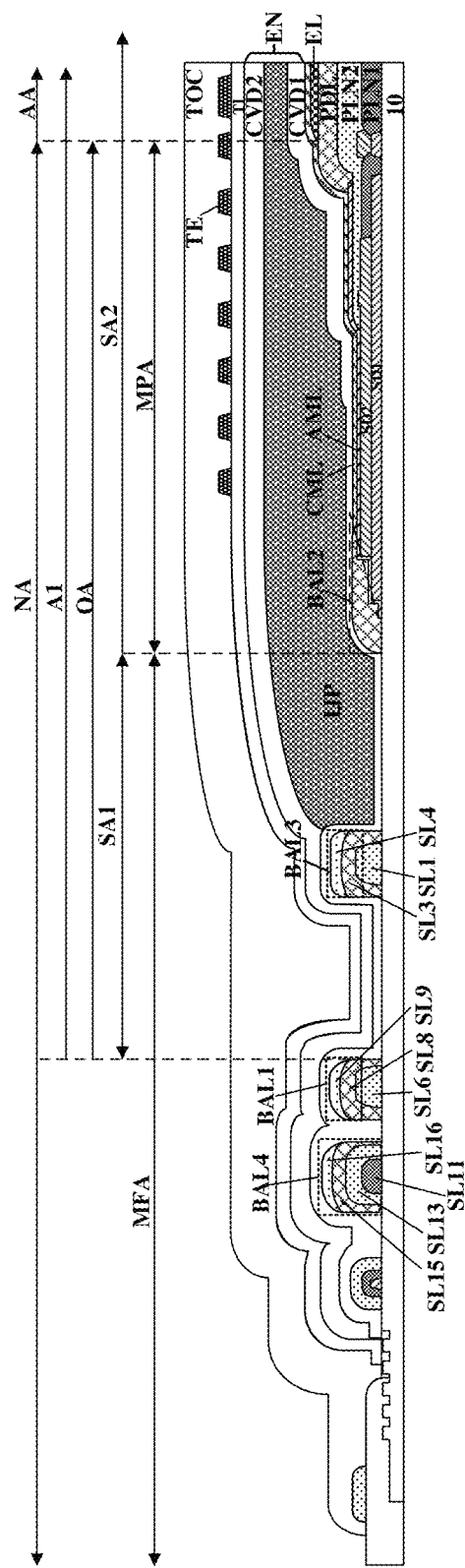
FIG. 15F shows a sectional view taken along line GG' in FIG. 15A.

FIG. 15E shows a sectional view taken along line EE' in FIG. 15A. FIG. 15F shows a sectional view taken along line GG' in FIG. 15A. Referring to FIG. 15E and FIG. 15F, in some embodiments, the display panel includes a base substrate 10 in the display area AA; a first signal line layer SD1 on the base substrate 10; a first planarization layer PLN1 on a side of the first signal line layer SD1 away from the base substrate 10; a second signal line layer SD2 on a side of the first planarization layer PLN1 away from the first signal line layer SD1; a second planarization layer PLN2 on a side of the second signal line layer SD2 away from the first planarization layer PLN1; an anode material layer AML on a side of the second planarization layer PLN2 away from the second signal line layer SD2; a pixel defining layer PDL on a side of the anode material layer AML away from the second planarization layer PLN2, where the pixel defining layer PDL defines a sub-pixel opening configured to receive an organic light-emitting material; an organic light-emitting material layer EL on a side of the pixel defining layer PDL away from the anode material layer AML; a cathode material layer CML on a side of the organic light-emitting material layer EL away from the anode material layer AML; an encapsulation layer EN on a side of the cathode material layer CML away from the organic light-emitting material layer EL; a touch insulating layer TI on a side of the encapsulation layer EN away from the cathode material layer CML; a touch electrode layer TE on a side of the touch insulating layer TI away from the encapsulation layer EN; and an outer coating layer TOC on a side of the touch electrode layer TE away from the touch insulating layer TI.

It will be noted that, in the embodiments shown in FIG. 15E and FIG. 15F, the first signal line layer SD1 corresponds to the above-mentioned third conductive layer 43, the second signal line layer SD2 corresponds to the above-mentioned fourth conductive layer 44, the anode material layer AML corresponds to the above-mentioned fifth conductive layer 45, and the cathode material layer CML corresponds to the above-mentioned sixth conductive layer 46.

In some embodiments, in the display area AA, the first signal line layer SD1 includes a plurality of signal lines, for example, a plurality of gate lines. In some embodiments, in the display area AA, the second signal line layer SD2 includes a plurality of signal lines, for example, a plurality of data lines. In some embodiments, in the display area AA, the anode material layer AML includes a plurality of anode electrodes of a plurality of light-emitting diodes. In some embodiments, in the display area AA, the cathode material layer CML includes one or more cathodes of light-emitting diodes.

In some embodiments, in at least part of a second peripheral sub-region, the display panel includes a base substrate 10; a first signal line layer SD1 on the base substrate 10; a first planarization layer PLN1 on a side of the first signal line layer SD1 away from the base substrate 10; a second signal line layer SD2 on a side of the first planarization layer PLN1 away from the first signal line layer SD1; a second planarization layer PLN2 on a side of the second signal line layer SD2 away from the first planarization layer PLN1; an anode material layer AML on a side of the second planarization layer PLN2 away from the second signal line layer SD2; a cathode material layer CML on a side of the anode material layer AML away from the second planarization layer PLN2; an encapsulation layer EN on a side of the cathode material layer CML away from the anode material layer AML; a touch insulating layer TI on a side of the encapsulation layer EN away from the cathode material layer CML; a touch electrode layer TE on a side of the touch insulating layer TI away from the encapsulation layer EN; and an outer coating layer TOC on a side of the touch electrode layer TE away from the touch insulating layer TI.

In some embodiments, in at least part of the second peripheral sub-region, the third barrier dam BAL3 includes a stacked structure, and the stacked structure includes a plurality of sub-layers stacked together. Referring to FIG. 15E, in an example, the plurality of sub-layers of the stacked structure include: a first sub-layer SL1 in a same layer as the second planarization layer PLN2; a second sub-layer SL2 on a side of the first sub-layer SL1 away from the base substrate 10, where the second sub-layer SL2 is in a same layer as the anode material layer AML; a third sub-layer SL3 on a side of the second sub-layer SL2 away from the first sub-layer SL1, where the third sub-layer SL3 is in a same layer as the pixel defining layer PDL; a fourth sub-layer SL4 on a side of the third sub-layer SL3 away from the second sub-layer SL2, where the fourth sub-layer SL4 is in a same layer as a spacer layer; and a fifth sub-layer SL5 on a side of the fourth sub-layer SL4 away from the third sub-layer SL3, where the fifth sub-layer SL5 is in a same layer as the cathode material layer CML. Optionally, the display panel includes a part of the second signal line layer SD2 on a side of the first sub-layer SL1 close to the base substrate 10. Optionally, the display panel further includes a part of the first signal line layer SD1 which is on a side of the above-mentioned part of the second signal line layer SD2 away from the first sub-layer SL1 and close to the base substrate BS. The spacer layer is made of an insulating material.

As used herein, the term "same layer" refers to a relationship between layers formed simultaneously in a same step. In an example, the first sub-layer SL1 and the second planarization layer PLN2 are in the same layer when they are formed through one or more steps of a same patterning process performed on a material deposited by using a same deposition process. In another example, by simultaneously performing a step of forming the first sub-layer SL1 and a step of forming the second planarization layer PLN2, the first sub-layer SL1 in the same layer as the second planarization layer PLN2 may be formed in the same layer. It will be noted that the term "same layer" does not always mean that layers have the same thickness or height in the sectional view.

In some embodiments, the first barrier dam BAL1 surrounding the first region includes a stacked structure, and the stacked structure includes a plurality of sub-layers stacked together. Referring to FIG. 15E, in at least part of the second peripheral sub-region, the plurality of sub-layers of the stacked structure includes: a sixth sub-layer SL6 in a same layer as the second planarization layer PLN2; a seventh sub-layer SL7 on a side of the sixth sub-layer SL6 away from the base substrate 10, where the seventh sub-layer SL7 is in a same layer as the anode material layer AML; an eighth sub-layer SL8 on a side of the seventh sub-layer SL7 away from the sixth sub-layer SL6, where the eighth sub-layer SL8 is in a same layer as the pixel defining layer PDL; and a ninth sub-layer SL9 on a side of the eighth sub-layer SL8 away from the seventh sub-layer SL7, where the ninth sub-layer SL9 is in a same layer as the spacer layer.

Referring to FIG. 15A and FIG. 15E, in some embodiments, the display panel further includes a fourth barrier dam BAL4. The fourth barrier dam BAL4 is in the peripheral area NA. The fourth barrier dam BAL4 forms an enclosure structure surrounding a second region, and the second region surrounds the first region. In some embodiments, in at least part of the second peripheral sub-region PSA2, the fourth barrier dam BAL4 includes a stacked structure, and the stacked structure includes a plurality of sub-layers stacked together. Referring to FIG. 15E, in an example, the plurality of sub-layers of the stacked structure include: a tenth sub-layer SL10 on the base substrate 10, where the tenth sub-layer SL10 is in a same layer as the first signal line layer SD1; an eleventh sub-layer Layer SL11 on a side of the tenth sub-layer SL10 away from the base substrate 10, where the eleventh sub-layer SL11 is in a same layer as the first planarization layer PLN1; a twelfth sub-layer SL12 on a side of the eleventh sub-layer SL11 away from the tenth sub-layer SL10, where the twelfth sub-layer SL12 is in a same layer as the second signal line layer SD2; a thirteenth sub-layer SL13 on a side of the twelfth sub-layer SL12 away from the eleventh sub-layer SL11, where the thirteenth sub-layer SL13 is in a same layer as the second planarization layer PLN2; a fourteenth sub-layer SL14 on a side of the thirteenth sub-layer SL13 away from the twelfth sub-layer SL12, where the fourteenth sub-layer SL14 is in a same layer as the anode material layer AML; a fifteenth sub-layer SL15 on a side of the fourteenth sub-layer SL14 away from the thirteenth sub-layer SL13, where the fifteenth sub-layer SL15 is in a same layer as the pixel defining layer PDL; and a sixteenth sub-layer SL16 on a side of the fifteenth sub-layer SL15 away from the fourteenth sub-layer SL14, where the sixteenth sub-layer SL16 is in a same layer as the spacer layer.

Referring to FIG. 15F, in some embodiments, in a first peripheral sub-region, the touch display panel includes: a base substrate 10; a first planarization layer PLN1 on the base substrate 10; a second planarization layer PLN2 on a side of the first planarization layer PLN1 away from the base substrate 10; an encapsulation layer EN on a side of the second planarization layer PLN2 away from the first planarization layer PLN1; a touch insulating layer TI on a side of the encapsulation layer EN away from the second planarization layer PLN2; a touch electrode layer TE on a side of the touch insulating layer TI away from the encapsulation layer EN; and an outer coating layer TOC on a side of the touch electrode layer TE away from the touch insulating layer TI.

In some embodiments, in the first peripheral sub-region, the third barrier dam BAL3 includes a stacked structure, and the stacked structure includes a plurality of sub-layers stacked together. Referring to FIG. 15F, in the first peripheral sub-region, the plurality of sub-layers of the stacked structure include: a first sub-layer SL1 in a same layer as the second planarization layer PLN2; a third sub-layer SL3 on a side of the first sub-layer SL1 away from the base substrate 10, where the third sub-layer SL3 is in a same layer as the pixel defining layer PDL; and a fourth sub-layer SL4 on a side of the third sub-layer SL3 away from the first sub-layer SL1, where the fourth sub-layer SL4 is in a same layer as the spacer layer. Comparing the third barrier dam BAL3 in the first peripheral sub-region (as shown in FIG. 15F) and the third barrier dam BAL3 in the second peripheral sub-region PSA2 (as shown in FIG. 15E), the second sub-layer SL2 (in the same layer as the anode material layer AML) and the fifth sub-layer SL5 (in the same layer as the cathode material layer CML) are substantially absent (for example, at least 80% absent, at least 85% absent, at least 90% absent, at least 95% absent, at least 99% absent, or 100% absent) from the third barrier dam BAL3 in the first peripheral sub-region. In addition, the first signal line layer SD1 and the second signal line layer SD2 are substantially absent (for example, at least 80% absent, at least 85% absent, at least 90% absent, at least 95% absent, at least 99% absent, or 100% absent) from the first peripheral sub-region.

In some embodiments, the first barrier dam BAL1 surrounding the first region includes a stacked structure, and the stacked structure includes a plurality of sub-layers stacked together. Referring to FIG. 15F, in the first peripheral sub-region, the plurality of sub-layers of the stacked structure include: a sixth sub-layer SL6 in a same layer as the second planarization layer PLN2; an eighth sub-layer SL8 on a side of the sixth sub-layer SL6 away from the base substrate 10, where the eighth sub-layer SL8 is in a same layer as the pixel defining layer PDL; and a ninth sub-layer SL9 on a side of the eighth sub-layer SL8 away from the sixth sub-layer SL6, where the ninth sub-layer SL9 is in a same layer as the spacer layer. Comparing the first barrier dam BAL1 in the first peripheral sub-region (as shown in FIG. 15F) and the first barrier dam BAL1 in the second peripheral sub-region PSA2 (as shown in FIG. 15E), the seventh sub-region (in the same layer as the anode material layer AML) is substantially absent (for example, at least 80% absent, at least 85% absent, at least 90% absent, at least 95% absent, at least 99% absent, or 100% absent) from the first barrier dam BAL1 in the first peripheral sub-region. In addition, the first signal line layer SD1 and the second signal line layer SD2 are substantially absent (for example, at least 80% absent, at least 85% absent, at least 90% absent, at least 95% absent, at least 99% absent, or 100% absent) from the first peripheral sub-region.

Referring to FIG. 15A and FIG. 15F, in some embodiments, the touch display panel further includes a fourth barrier dam BAL4. The fourth barrier dam BAL4 is in the peripheral area NA. The fourth barrier dam BAL4 forms an enclosure structure surrounding a second region, and the second region surrounds the first region. In some embodiments, in the first peripheral sub-region, the fourth barrier dam BAL4 includes a stacked structure, and the stacked structure includes a plurality of sub-layers stacked together. Referring to FIG. 15F, in the first peripheral sub-region, the plurality of sub-layers of the stacked structure include: an eleventh sub-layer SL11 in a same layer as the first planarization layer PLN1; a thirteenth sub-layer SL13 on a side of the eleventh sub-layer SL11 away from the base substrate 10, where the thirteenth sub-layer SL13 is in a same layer as the second planarization layer PLN2; a fifteenth sub-layer SL15 on a side of the thirteenth sub-layer SL13 away from the eleventh sub-layer SL11, where the fifteenth sub-layer SL15 is in a same layer as the pixel defining layer PDL; and a sixteenth sub-layer SL16 on a side of the fifteenth sub-layer SL15 away from the thirteenth sub-layer SL13, where the sixteenth sub-layer SL16 is in a same layer as the spacer layer. Comparing the fourth barrier dam BAL4 in the first peripheral sub-region (as shown in FIG. 15F) and the fourth barrier dam BAL4 in the second peripheral sub-region PSA2 (as shown in FIG. 15E), the tenth sub-layer SL10 in the same layer as the first signal line layer SD1, the twelfth sub-layer SL12 in the same layer as the second signal line layer SD2, and the fourteenth sub-layer SL14 in the same layer as the anode material layer AML are substantially absent (for example, at least 80% absent, at least 85% absent, at least 90% absent, at least 95% absent, at least 99% absent, or 100% absent) from the fourth barrier dam BAL4 in the first peripheral sub-region. In addition, the first signal line layer SD1 and the second signal line layer SD2 are substantially absent (for example, at least 80% absent, at least 85% absent, at least 90% absent, at least 95% absent, at least 99% absent, or 100% absent) from the first peripheral sub-region.

In some embodiments, an organic encapsulation material sub-layer is substantially (e.g., at least 80%, at least 85%, at least 90%, at least 95%, at least 99%, or 100%) provided in the second sub-region. By providing the organic encapsulation material sub-layer in the second sub-region, even if a small degree of cracks occurs in a second inorganic encapsulation material sub-layer, the touch display panel may still maintain relatively excellent water resistance and oxygen resistance. This is because no organic encapsulation material sub-layer is provided in a region with cracks (e.g., a region between the first barrier layer and the fourth barrier layer), and water/oxygen does not easily penetrate the touch display panel where no organic material is provided.

By combining the third barrier layer with the second barrier layer, it is possible to stably control an overflow of the ink of the organic encapsulation material during printing. In particular, a flatter organic encapsulation material sub-layer may be formed consistently in the peripheral area. Through the flatter organic encapsulation material sub-layer, a slope at an edge of the organic encapsulation material sub-layer in the peripheral area may be greatly reduced, and the touch electrode layer formed near the edge of the organic encapsulation material sub-layer may be manufactured more reliably, thereby avoiding the problem of open circuit or short circuit in the touch electrode layer, especially when the touch electrode are formed by using grid lines.

In some embodiments, the organic encapsulation material sub-layer is substantially absent (e.g., at least 80% absent, at least 85% absent, at least 90% absent, at least 95% absent, at least 99% absent, or 100% absent) from the first sub-region SA1, the organic encapsulation material sub-layer is at least partially provided in the second sub-region SA2, and the organic encapsulation material sub-layer is provided in the entire display area AA.

Figure 8:
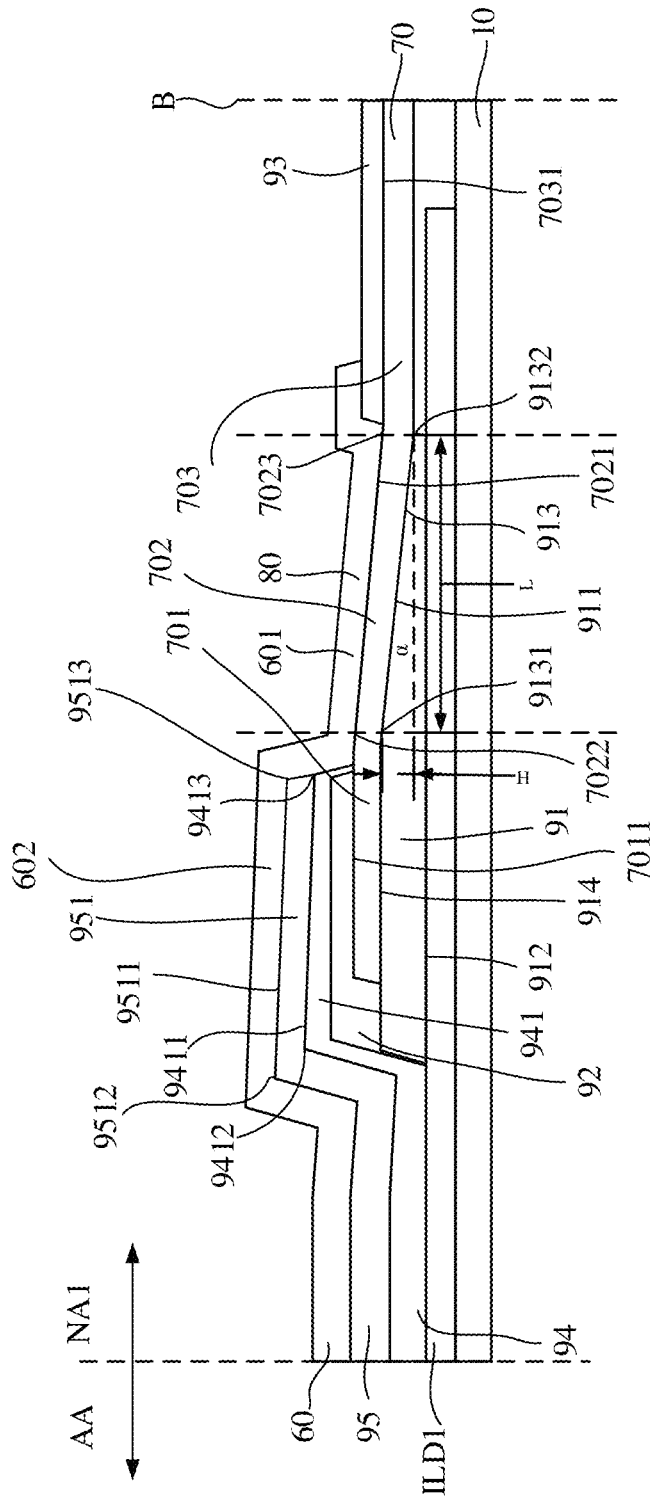
FIG. 8 shows a sectional view of the touch display panel taken along line FF' in FIG. 2 according to an embodiment of the present disclosure, in which a sectional structure of the touch display panel extending from a display area to a peripheral area is schematically shown.

FIG. 8 shows a sectional view of the touch display panel taken along line FF' in FIG. 2 according to the embodiments of the present disclosure, in which a sectional structure of a touch display panel extending from a display area to a peripheral area is schematically shown. Referring to FIG. 2 and FIG. 8, in the peripheral area (for example, the first frame area), the touch display panel includes a touch wire 60. The touch wire 60 is electrically connected to the touch electrode, and extends from the display area AA to the first frame sub-region NAI1. For example, the touch wire 60 is provided on a side of the encapsulation layer 20 away from the base substrate 10. The touch wire 60 may be located in at least one of the first touch layer 31 and the second touch layer 32. For example, the touch wire 60 may be located in the second touch layer 32.

In the peripheral area (for example, the first frame area), the touch display panel further includes a touch lead 70 extending from the first frame sub-region NAI1 to the second frame sub-region NA12. For example, the touch lead 70 may be located in the fourth conductive layer 44.

One end of the touch wire 60 is electrically connected to the touch electrode(s) (first touch electrode and/or second touch electrode) in the display area, and the other end of the touch wire 60 is electrically connected to the touch lead 70. One end of the touch lead 70 is electrically connected to the touch wire 60, and the other end of the touch lead 70 is electrically connected to structures such as a driver chip (IC) and a flexible printing circuit (FPC) for controlling the display and touch of the display area AA. In this way, touch control signals on the driver chip (IC) and the flexible printing circuit (FPC) may be transmitted to each touch electrode.

As shown in FIG. 8, the touch display panel may include a contact groove 80. The other end of the touch wire 60 is electrically connected to the touch lead 70 through the contact groove 80.

It will be noted that, in the embodiments of the present disclosure, the expression "contact groove" is not limited to a form of groove, and the form of the contact groove may include but not limited to groove, via hole, and the like. The contact groove is mainly used to permit a contact between two components located in different conductive layers, so as to achieve an electrical connection between the two components.

Referring to FIG. 8, in the peripheral area (for example, the first frame area), the touch display panel includes a first supporting structure 91 and a second supporting structure 92. The first supporting structure 91 may be located in the first planarization layer PLN1, and the second supporting structure 92 may be located in the second planarization layer PLN2.

The first supporting structure 91 may include a first surface 911 away from the base substrate 10 and a second surface 912 close to the base substrate 10. The second surface 912 is a flat surface, that is, the second surface 912 is substantially parallel to the upper surface of the base substrate 10.

At least part of the first surface 911 is an inclined surface. Specifically, the first surface 911 includes a first portion 913 and a second portion 914, and the second portion 914 is closer to the display area AA than the first portion 913. The second portion 914 is a flat surface, that is, the second portion 914 is substantially parallel to the upper surface of the base substrate 10. The first portion 913 is an inclined surface, that is, the first portion 913 is not parallel to the upper surface of the base substrate 10, and is inclined with respect to the upper surface of the base substrate 10.

The first portion 913 of the first surface 911 has a first end 9131 close to the display area and a second end 9132 away from the display area. A height at the second end 9132 is less than that a height at the first end 9131, that is, in a direction perpendicular to the upper surface of the base substrate 10, the second end 9132 is closer to the upper surface of the base substrate 10 than the first end 9131.

For example, a thickness of the first planarization layer PLN1 may range from 1 micron to 10 microns, such as about 1.5 microns, 2 microns, 3 microns, 5 microns, 8 microns, or 10 microns. A thickness of a region where the second portion 914 of the first supporting structure 91 is located is substantially equal to the height of the first planarization layer PLN1, that is, the thickness of the region where the first portion 913 of the first supporting structure 91 is located may range from 1 micron to 10 microns, such as about 1.5 microns, 2 microns, 3 microns, 5 microns, 8 microns, or 10 microns. A thickness of the first supporting structure 91 at the first end 9131 is substantially equal to the thickness of the region where the second portion 914 of the first supporting structure 91 is located. A thickness of the first supporting structure 91 at the second end 9132 is less than the thickness of the first supporting structure 91 at the first end 9131. In some exemplary embodiments, the thickness of the first supporting structure 91 at the second end 9132 is less than 1 micron, for example, less than 0.5 micron, or may be substantially equal to zero. That is, a height difference between the second end 9132 and the first end 9131 may range from 0.5 microns to 10 microns.

In the embodiments of the present disclosure, a slope $\alpha$ of the first portion 913 of the first surface 911 (i.e., an inclination angle of the first portion 913 of the first surface 911 with respect to a horizontal plane) is less than a specified slope threshold. The slope $\alpha$ of the first portion 913 of the first surface 911 is related to the height difference between the second end 9132 and the first end 9131 and a width of an orthographic projection of the first portion 913 on the base substrate. For example, $\tan \alpha = H/L$, where H represents the height difference between the second end 9132 and the first end 9131, and L represents the width of the orthographic projection of the first portion 913 on the base substrate. A direction from the display area AA to the second frame sub-region NA12 in FIG. 8 may be defined as the first direction X, and a size of the orthographic projection of the first portion 913 on the base substrate in the first direction X is the width thereof.

For example, in some examples, L may range from 10 microns to 50 microns, such as about 10 microns, about 20 microns, 25 microns, 30 microns, 40 microns, or 50 microns. For example, L may be about 20 microns, H may be about 8 microns, then there is $\tan \alpha = 0.4$, and the slope $\alpha$ of the first portion 913 of the first surface 911 is about 21.8°.

In the embodiments of the present disclosure, the specified slope threshold is related to multiple factors, for example, related to a width required to be reduced for the lower frame of the display panel, a formation process of CVD, and other factors. Those factors will be further described in detail below.

The second supporting structure 92 is formed on a side of the first supporting structure 91 away from the base substrate 10. An orthographic projection of the second supporting structure 92 on the base substrate 10 at least partially overlaps with an orthographic projection of the first supporting structure 91 on the base substrate 10. For example, the orthographic projection of the second supporting structure 92 on the base substrate 10 substantially falls within the orthographic projection of the first supporting structure 91 on the base substrate 10. Referring to FIG. 8, the orthographic projection of the second supporting structure 92 on the base substrate 10 substantially falls within an orthographic projection of the second portion 914 on the base substrate 10, that is, the second supporting structure 92 is formed substantially on the flat surface of the first supporting structure 91, not on the inclined surface of the first supporting structure 91.

At least part of the touch lead 70 is located on the inclined surface of the first supporting structure 91, that is, at least part of the touch lead 70 is also arranged obliquely. For example, the touch lead 70 may include a first touch lead portion 701, a second touch lead portion 702, and a third touch lead portion 703. The second touch lead portion 702 is between the first touch lead portion 701 and the third touch lead portion 703. It will be understood that for convenience of description, the touch lead 70 is divided into three portions for description, but the first touch lead portion 701, the second touch lead portion 702 and the third touch lead portion 703 may extend continuously, that is, the three portions are connected as one. The first touch lead portion 701 is closer to the display area AA than the third touch lead portion 703.

An orthographic projection of the first touch lead portion 701 on the base substrate 10 at least partially overlaps with the orthographic projection of the first supporting structure 91 on the base substrate 10. For example, the orthographic projection of the first touch lead portion 701 on the base substrate 10 substantially falls within the orthographic projection of the first supporting structure 91 on the base substrate 10. Referring to FIG. 8, the orthographic projection of the first touch lead portion 701 on the base substrate 10 substantially falls within an orthographic projection of the second portion 914 on the base substrate 10, that is, the first touch lead portion 701 is formed substantially on the flat surface of the first supporting structure 91, but not formed on the inclined surface of the first supporting structure 91. The first touch lead portion 701 is sandwiched between the first portion 913 of the first supporting structure 91 and the second supporting structure 92. The first touch lead portion 701 is on the flat surface portion of the first supporting structure 91, so that the first touch lead portion 701 extends substantially parallel to the upper surface of the base substrate 10.

An orthographic projection of the second touch lead portion 702 on the base substrate 10 at least partially overlaps with the orthographic projection of the first supporting structure 91 on the base substrate 10. For example, the orthographic projection of the second touch lead portion 702 on the base substrate 10 substantially falls within the orthographic projection of the first supporting structure 91 on the base substrate 10. Referring to FIG. 8, the orthographic projection of the second touch lead portion 702 on the base substrate 10 substantially falls within the orthographic projection of the first portion 913 on the base substrate 10, that is, the second touch lead portion 702 is substantially formed on the inclined surface of the first supporting structure 91. Accordingly, the second touch lead portion 702 is arranged along the inclined portion (i.e., the first portion 913) of the first supporting structure 91. That is, the second touch lead portion 702 is arranged obliquely with respect to the upper surface of the base substrate 10.

The touch display panel may further include a third supporting structure 93, and the third supporting structure 93 may also be located in the second planarization layer PLN2. That is, the second supporting structure 92 and the third supporting structure 93 are located in the same layer. The third supporting structure 93 is spaced apart from the second supporting structure 92, and the third supporting structure 93 is located on a side of the second supporting structure 92 away from the display area AA. The contact groove 80 is formed between the third supporting structure 93 and the second supporting structure 92.

An orthographic projection of the third touch lead portion 703 on the base substrate 10 substantially does not overlap with the orthographic projection of the first supporting structure 91 on the base substrate 10, and the orthographic projection of the third touch lead portion 703 on the base substrate 10 at least partially overlaps with the orthographic projection of the third supporting structure 93 on the base substrate 10. The third touch lead portion 703 extends substantially parallel to the upper surface of the base substrate 10.

Referring to FIG. 8, the touch lead 70 has an upper surface away from the base substrate 10, which corresponds to the first touch lead portion 701, the second touch lead portion 702 and the third touch lead portion 703, where the first touch lead portion 701 has a first lead surface 7011 away from the base substrate 10, the second touch lead portion 702 has a second lead surface 7021 away from the base substrate 10, and the third touch lead portion 703 has a third lead surface 7031 away from the base substrate 10.

The second lead surface 7021 extends obliquely with respect to the upper surface of the base substrate 10. The second lead surface 7021 is substantially parallel to the first portion 913 of the first surface 911. The first lead surface 7011 and the third lead surface 7031 are substantially parallel to the upper surface of the base substrate 10.

Specifically, the second lead surface 7021 may have a first end 7022 close to the display area and a second end 7023 away from the display area. A height at the second end 7023 is less than a height at the first end 7022. That is, in the direction perpendicular to the upper surface of the base substrate 10, the second end 7023 is closer to the upper surface of the base substrate 10 than the first end 7022.

For example, the touch lead 70 has substantially the same thickness throughout its entire extension length. Then, a slope of the second lead surface 7021 is substantially equal to a slope of the first portion 913 of the first surface 911. A height difference between the second end 7023 and the first end 7022 of the second lead surface 7021 is substantially equal to the height difference between the second end 9132 and the first end 9131 of the first portion 913, that is, the height difference between the second end 7023 and the first end 7022 of the second lead surface 7021 may also range from 0.5 microns to 10 microns.

In the embodiments of the present disclosure, the second lead surface 7021 of the touch lead 70 serves as a bottom of the contact groove 80, so that the bottom of the contact groove 80 also extends obliquely with respect to the upper surface of the base substrate 10. A slope of the bottom of the contact groove 80 is substantially equal to the slope of the first portion 913 of the first surface 911. A side surface of the second supporting structure 92 away from the display area AA and a side surface of the third supporting structure 93 close to the display area AA may respectively serves as at least parts of two side surfaces of the contact groove 80 facing each other.

With continued reference to FIG. 8, in the peripheral area (for example, the first frame area), the touch display panel further includes a first covering structure 94 and a second covering structure 95. The first covering structure 94 may include a portion(s) in at least one of the first encapsulation sub-layer 201 and the third encapsulation sub-layer 203. The second covering structure 95 may include a portion in the touch insulating layer 33. That is, at least one of the first encapsulation sub-layer 201 and the third encapsulation sub-layer 203 may extend from the display area AA to the first frame sub-region NA11, and the portion of at least one of the first encapsulation sub-layer 201 and the third encapsulation sub-layer 203 extending to the first frame sub-region NA11 serves as the first covering structure 94. The touch insulating layer 33 may extend from the display area AA to the first frame sub-region NA11, and the portion of the touch insulating layer 33 extending to the first frame sub-region NA11 serves as the second covering structure 95.

Figure 9:
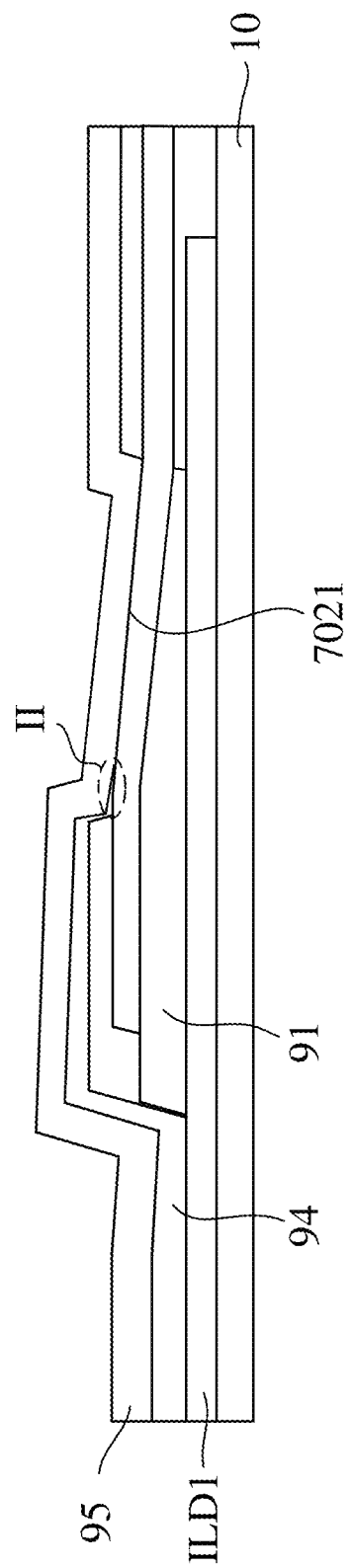
FIG. 9 shows a sectional view of the touch display panel taken along line FF' in FIG. 2 according to an embodiment of the present disclosure, in which a sectional structure of the touch display panel in a process of forming an encapsulation layer and a touch layer is schematically shown.

FIG. 9 shows a sectional view of the touch display panel taken along line FF' in FIG. 2 according to an embodiment of the present disclosure, in which a sectional structure of the touch display panel in a process of forming an encapsulation layer and a touch layer is schematically shown. Referring to FIG. 5, FIG. 8 and FIG. 9, in the embodiments of the present disclosure, inorganic layers in the encapsulation layer, namely the first encapsulation sub-layer 201 and the third encapsulation sub-layer 203, are formed by using a chemical vapor deposition process. During the chemical vapor deposition process, part of the inorganic material is formed on the second lead surface 7021 of the touch lead 70, as shown in box II in FIG. 9. Due to the inclined structure of the second lead surface 7021 of the touch lead 70, the chemical vapor deposition process has a poor film-forming ability on the inclined structure, so that the inorganic material formed on the second lead surface 7021 of the touch lead 70 has a small thickness. That is, in the chemical vapor deposition process, the thickness of the inorganic material formed on the second lead surface 7021 of the touch lead 70 is much smaller than a thickness of the inorganic material formed on the flat structure. After the chemical vapor deposition process, a pattern of the touch insulating layer 23 is formed by using a photolithography process. In the photolithography process, a part of the touch insulating layer 23 formed in the contact groove 80 needs to be removed by using an etching process. In this etching process, a certain degree of over-etching may generally be performed. Due to the small thickness of the inorganic material formed on the second lead surface 7021 of the touch lead 70, the inorganic material formed on the second lead surface 7021 of the touch lead 70 may be easily removed through this etching process. Then, it is conducive to a complete contact between the touch wire 60 formed in the subsequent process and the touch lead 70 in the contact groove 80. That is, it is beneficial to an increase of a contact area between the touch wire 60 and the touch lead 70 in the contact groove 80, so as to improve a contact performance between the two.

In the embodiments of the present disclosure, by designing the slope α, it is possible to control the thickness of the inorganic material formed on the second lead surface 7021 of the touch lead 70, so as to improve the contact performance between the touch wire 60 and the touch lead 70.

In the embodiments of the present disclosure, the first covering structure 94 has a first portion 941, and an orthographic projection of the first portion 941 on the base substrate 10 substantially coincides with the orthographic projection of the second supporting structure 92 on the base substrate 10. As shown in FIG. 8, the first portion 941 has an upper surface 9411 away from the base substrate 10, and the upper surface 9411 is an inclined surface. That is, the first portion 941 of the first covering structure 94 formed by the chemical vapor deposition process has an inclined upper surface. For example, the upper surface 9411 of the first portion 941 has a first end 9412 close to the display area and a second end 9413 away from the display area. For the upper surface 9411 of the first portion 941, a height at the second end 9413 is less than a height at the first end 9412, that is, in the direction perpendicular to the upper surface of the base substrate 10, the second end 9413 is closer to the upper surface of the base substrate 10 than the first end 9412.

Accordingly, the second covering structure 95 has a first portion 951, and an orthographic projection of the first portion 951 on the base substrate 10 substantially coincides with the orthographic projection of the second supporting structure 92 on the base substrate 10. As shown in FIG. 8, the first portion 951 has an upper surface 9511 away from the base substrate 10, and the upper surface 9511 is an inclined surface. For example, the upper surface 9511 of the first portion 951 has a first end 9512 close to the display area and a second end 9513 away from the display area. For the upper surface 9511 of the first portion 951, a height at the second end 9513 is less than a height at the first end 9512, that is, in the direction perpendicular to the upper surface of the base substrate 10, the second end 9513 is closer to the upper surface of the base substrate 10 than the first end 9512.

With continued reference to FIG. 8, the second supporting structure 92, the first covering structure 94 and the second covering structure 95 respectively have side surfaces away from the display area AA, and the side surfaces of the second supporting structure 92, the first covering structure 94 and the second covering structure 95 respectively serve as parts of a side surface of the contact grooves 60 close to the display area AA. Orthographic projections of the side surfaces of the second supporting structure 92, the first covering structure 94 and the second covering structure 95 on the base substrate 10 all fall within the orthographic projection of the second portion 914 of the first surface 911 on the base substrate 10. That is, extensions of the second supporting structure 92, the first covering structure 94 and the second covering structure 95 substantially end at a position of the flat surface of the first supporting structure 91, or in other words, at a starting position of the inclined surface of the first supporting structure 91.

The touch wire 60 is on a side of the second covering structure 95 away from the base substrate 10. The touch wire 60 includes a first touch wire portion 601 in the contact groove 80, and the touch wire 60 further includes a third touch wire portion 602 on a side of the first touch wire portion 601 close to the display area AA.

An orthographic projection of the first touch wire portion 601 on the base substrate 10 at least partially overlaps with an orthographic projection of the second touch lead portion 702 on the base substrate 10. For example, the orthographic projection of the first touch wire portion 601 on the base substrate 10 substantially coincides with the orthographic projection of the second touch lead portion 702 on the base substrate 10.

The first touch wire portion 601 is in direct contact with the second touch lead portion 702 in the contact groove 80. In the embodiments of the present disclosure, a contact portion of the first touch wire part 601 and the second touch lead portion 702 has a size in its extension direction substantially equal to a size of the first portion 913 in an extension direction of the first portion 913, and a size of a contact portion between the first touch wire part 601 and the second touch lead portion 702 in the first direction X is substantially equal to a size of the orthographic projection of the first portion 913 on the base substrate (that is, the above-mentioned L). That is to say, since no insulating material such as inorganic material remains in the contact groove 80, the first touch wire part 601 and the second touch lead portion 702 are in full contact in the contact groove 80, which may ensure a large contact area between the first touch wire portion 601 and the second touch lead portion 702, so that the contact performance between the two may be improved.

In the embodiments of the present disclosure, the second lead surface 7021 of the touch lead 70 serves as the bottom of the contact groove 80, so that the bottom of the contact groove 80 extends obliquely with respect to the upper surface of the base substrate 10. In this way, the first touch wire portion 601 of the touch wire 60 also extends obliquely with respect to the upper surface of the base substrate 10.

Figure 10:
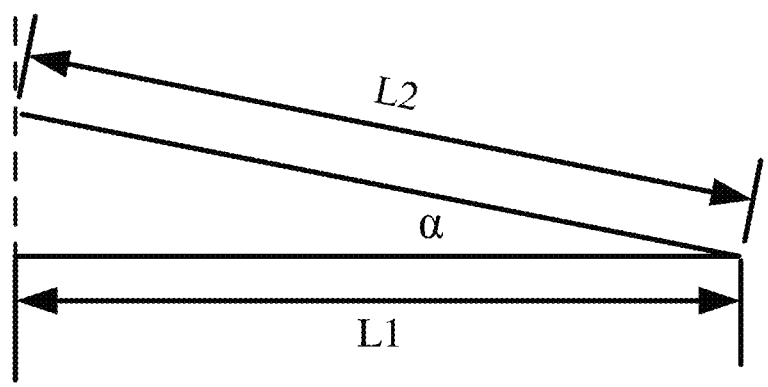
FIG. 10 schematically shows a comparison diagram between an oblique extension and a horizontal extension of a portion of a touch wire in contact with a touch lead.

FIG. 10 schematically shows a comparison diagram between an oblique extension and a horizontal extension of a portion of the touch wire in contact with the touch lead. Referring to FIG. 10, in a case that the portion of the touch wire in contact with the touch lead extends horizontally, a width of the portion of the touch wire in contact with the touch lead in its extension direction (i.e., horizontal direction) may be denoted as L1; in a case that the portion of the touch wire in contact with the touch lead extends obliquely, an inclination angle (i.e., slope) of the portion of the touch wire in contact with the touch lead is denoted as u, and the width of the portion of the touch wire in contact with the touch lead in its extension direction (i.e., the inclination direction) may be denoted as L2.

In the case that the portion of the touch wire in contact with the touch lead extends horizontally, a width of the frame area occupied by the portion of the touch wire in contact with the touch lead is L1. In the case that the portion of the touch wire in contact with the touch lead extends obliquely, a width of the frame area occupied by the portion of the touch wire in contact with the touch lead is L2*cos α. For example, when the slope α is about 21.8°, cos α is approximately equal to 0.93. If the width of the portion of the touch wire in contact with the touch lead in its extension direction remains unchanged, that is, if the contact area between the touch wire and the touch lead remains unchanged, i.e., L2=L1, then the occupied width of the frame area may be 0.93 of the original width, that is, the frame width may be reduced by about 7%. Therefore, in the embodiments of the present disclosure, the width of the frame area may be effectively reduced through the inclination arrangement, which is beneficial to achieve a narrow-frame display device.

Figure 11:
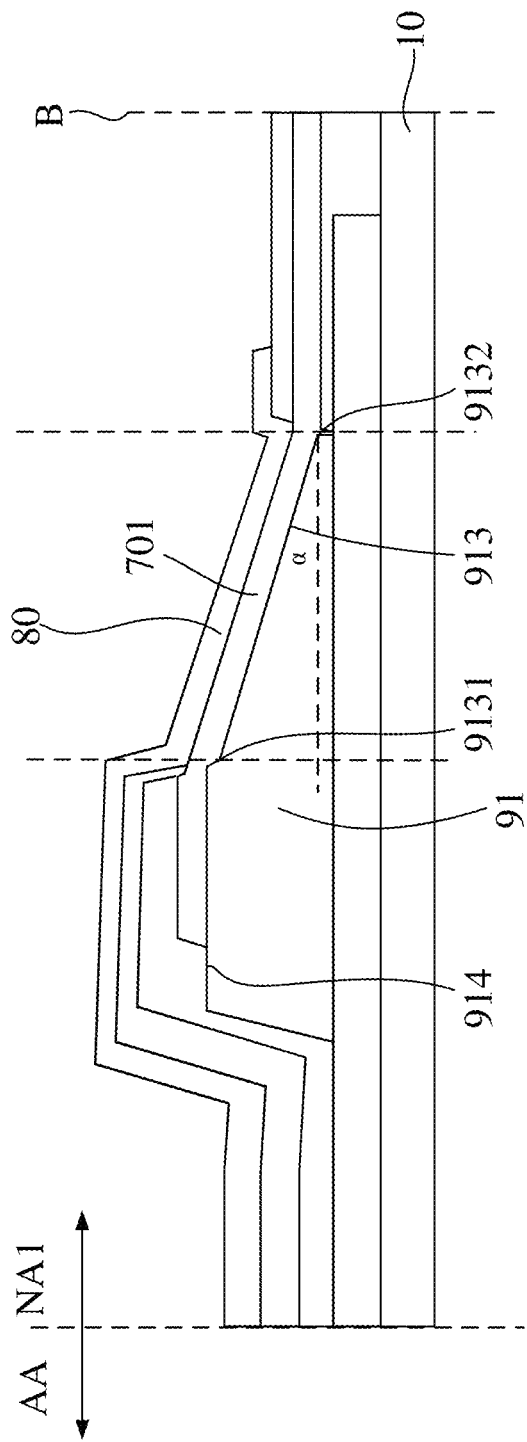
FIG. 11 shows a sectional view of a touch display panel taken along line FF' in FIG. 2 according to some other exemplary embodiments of the present disclosure, in which a sectional structure of the touch display panel extending from the display area to the peripheral area is schematically shown.
Figure 12:
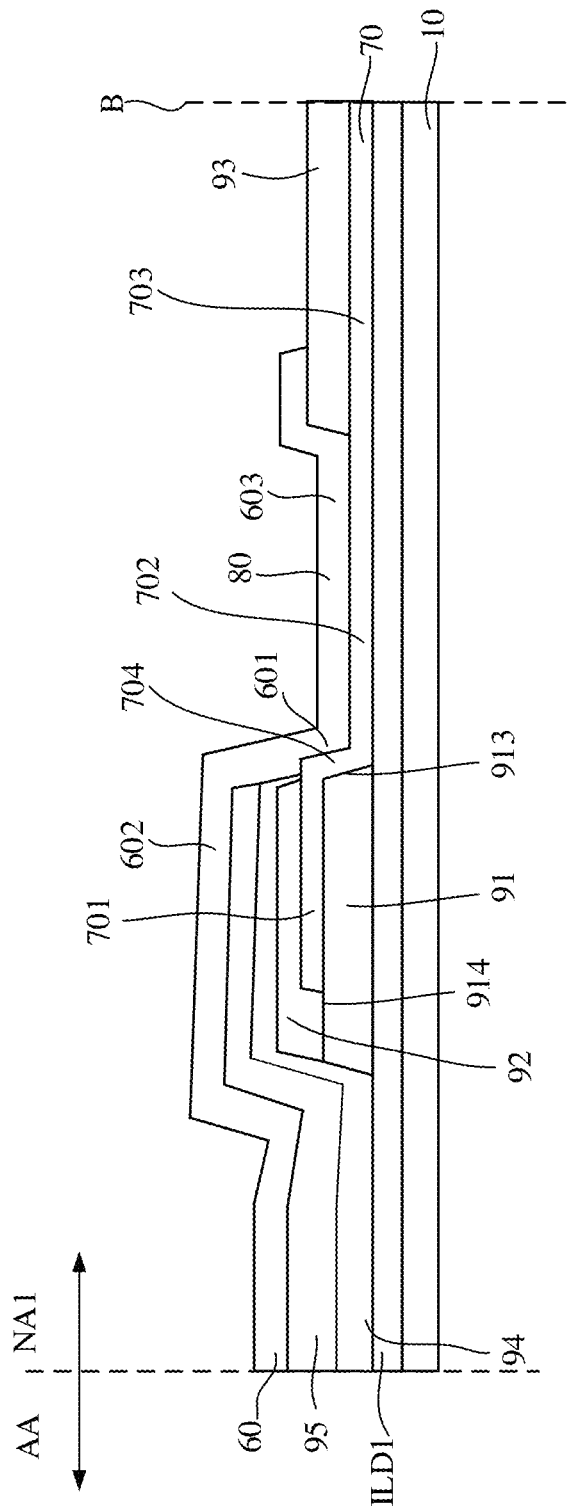
FIG. 12 shows a sectional view of the touch display panel taken along the line FF' in FIG. 2 according to some exemplary embodiments of the present disclosure, in which a sectional structure of the touch display panel extending from a display area to a peripheral area is schematically shown.
Figure 13:
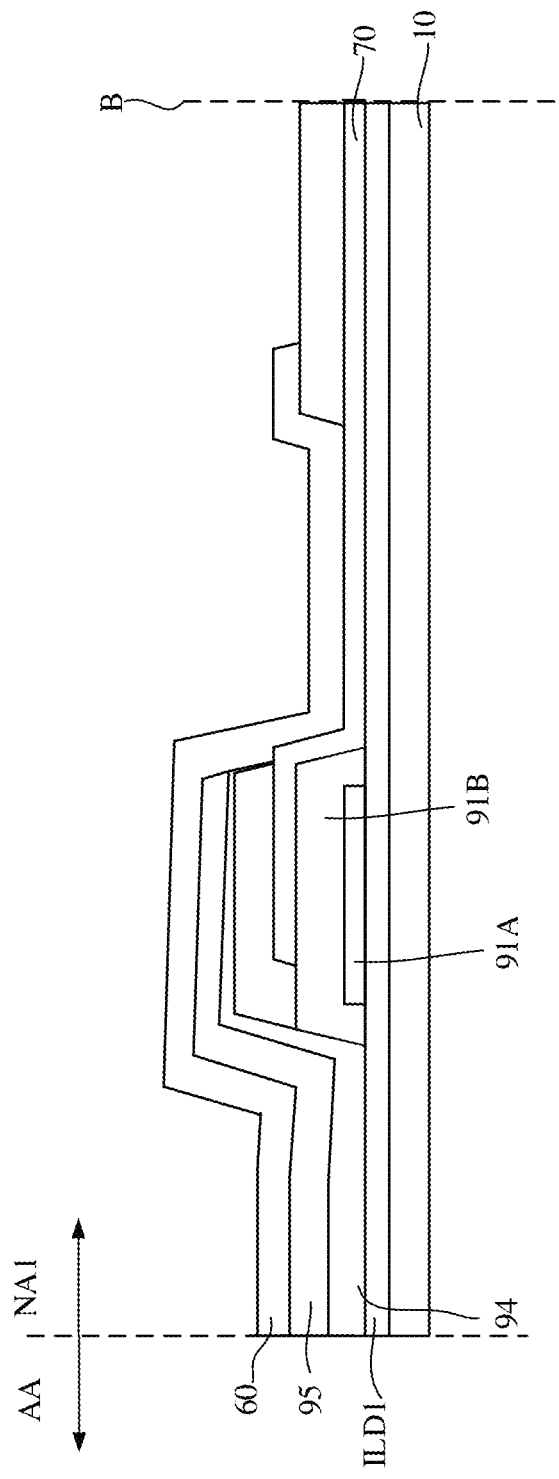
FIG. 13 shows a sectional view of a touch display panel taken along line FF' in FIG. 2 according to some other embodiments of the present disclosure, in which a sectional structure of the touch display panel extending from the display area to the peripheral area is schematically shown.

FIG. 11 shows a sectional view of a touch display panel taken along line FF' in FIG. 2 according to some other exemplary embodiments of the present disclosure, in which a sectional structure of the touch display panel extending from the display area to the peripheral area is schematically shown. It will be noted that the following will mainly describe differences between the embodiments shown in FIG. 11 and the above-mentioned embodiments, and the similarities may refer to the above descriptions, which will not be repeated here.

Referring to FIG. 2, FIG. 8 and FIG. 11, in some embodiments of the present disclosure, the first supporting structure 91 is not limited to be provided in the first planarization layer PLN1.

For example, the first supporting structure 91 may include a structure in at least one film layer other than the first planarization layer PLN1.

For example, the first supporting structure 91 may include a structure located in a plurality of film layers, where a part of the first supporting structure 91 may be located in the first planarization layer PLN1, and another part of the first supporting structure 91 may be located in at least one film layer other than the first planarization layer PLN1.

For example, the first supporting structure 91 and the film layer in the display area AA may be formed by the same patterning process, or the first supporting structure 91 and the film layer in the display area AA may be formed by different patterning processes, that is, the first supporting structure 91 may be formed separately.

In the embodiments shown in FIG. 11, the first supporting structure 91 may include a first surface 911 away from the base substrate 10 and a second surface 912 close to the base substrate 10. The second surface 912 is a flat surface, that is, the second surface 912 is substantially parallel to the upper surface of the base substrate 10.

At least part of the first surface 911 is an inclined surface. Specifically, the first surface 911 includes a first portion 913 and a second portion 914, and the second portion 914 is closer to the display area AA than the first portion 913. The second portion 914 is a flat surface, that is, the second portion 914 is substantially parallel to the upper surface of the base substrate 10. The first portion 913 is an inclined surface, that is, the first portion 913 is not parallel to the upper surface of the base substrate 10 and forms an inclined angle with the upper surface of the base substrate 10.

The first portion 913 of the first surface 911 has a first end 9131 close to the display area and a second end 9132 away from the display area. A height at the second end 9132 is less than a height at the first end 9131, that is, in the direction perpendicular to the upper surface of the base substrate 10, the second end 9132 is closer to the upper surface of the base substrate 10 than the first end 9131.

For example, a thickness of the second portion 914 of the first supporting structure 91 may range from 1 micron to 50 microns, such as about 1.5 microns, 2 microns, 3 microns, 5 microns, 8 microns, 10 microns, 15 microns, 20 microns, 30 microns, 40 microns, or 50 microns. A thickness of the first portion 913 at the first end 9131 is substantially equal to the thickness of the second portion 914. A thickness of the first portion 913 at the second end 9132 is less than the thickness of the first portion 913 at the first end 9131. In some exemplary embodiments, the thickness of the first portion 913 at the second end 9132 is less than 1 micron, e.g., less than 0.5 microns, or may be substantially equal to zero. That is to say, a height difference between the second end 9132 and the first end 9131 may range from 0.5 microns to 50 microns.

In the embodiments of the present disclosure, a slope α of the first portion 913 of the first surface 911 (i.e., the inclination angle of the first portion 913 of the first surface 911 with respect to the horizontal plane) is less than a specified slope threshold. The slope α of the first portion 913 of the first surface 911 is related to the height difference between the second end 9132 and the first end 9131 and a width of the orthographic projection of the first portion 913 on the base substrate. For example, there is tan α=H/L, where H represents the height difference between the second end 9132 and the first end 9131, and L represents the width of the orthographic projection of the first portion 913 on the base substrate.

For example, in some examples, L may range from 10 microns to 50 microns, such as about 10 microns, about 20 microns, 25 microns, 30 microns, 40 microns, or 50 microns. For example, L may be about 30 microns, H may be about 15 microns, then there is tan α=0.5, and the slope α of the first portion 913 of the first surface 911 is about 26.6°. For example, when the slope α is about 26.6°, if the portion of the touch wire in contact with the touch lead has a width in its extension direction unchanged, that is, if the contact area between the touch wire and the touch lead remains unchanged, i.e., L2=L1, then the width occupied by the frame area may be 0.89 of the original width, that is, the frame width may be reduced by about 11%.

In this way, the slope of the touch wire and the slope of touch lead which are in the contact groove may be further increased, which is more conducive to the reduction of the frame width of the touch display panel.

Figure 16:
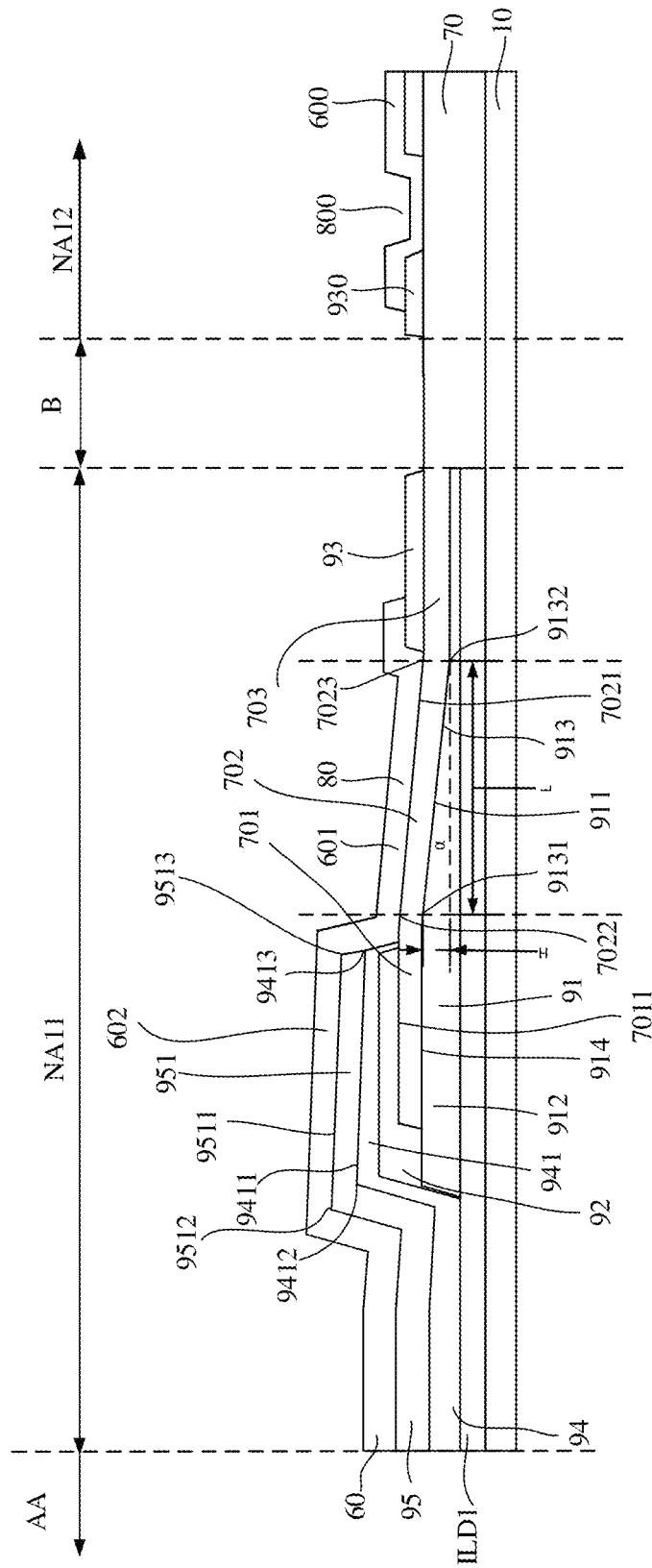
FIG. 16 shows a sectional view of a touch display panel taken along line FF' in FIG. 2 according to some exemplary embodiments of the present disclosure, in which a sectional structure of the touch display panel extending from the display area to a first frame sub-region, a bending region and a second frame sub-region is schematically shown.

FIG. 16 shows a sectional view of a touch display panel taken along line FF' in FIG. 2 according to some exemplary embodiments of the present disclosure, in which a sectional structure of the touch display panel extending from the display area to a first frame sub-region, a bending region and a second frame sub-region is schematically shown. It will be noted that the following will mainly describe differences from the above-mentioned embodiments, and other parts may refer the above descriptions.

Referring to FIG. 2, FIG. 8 and FIG. 16, in the peripheral area (such as the first frame area), the touch display panel includes a touch wire 60, which is electrically connected to the touch electrode and extends from the display area AA to the first frame sub-region NA11. For example, the touch wire 60 is provided on a side of the encapsulation layer 20 away from the base substrate 10. The touch wire 60 may be located in at least one of the first touch layer 31 and the second touch layer 32. For example, the touch wire 60 may be located in the second touch layer 32.

In the peripheral area (for example, the first frame area), the touch display panel further includes a touch lead 70 extending from the first frame sub-region NA11 to the second frame sub-region NA12. For example, the touch lead 70 may be located in the fourth conductive layer 44. Referring to FIG. 16, the touch lead 70 may extend from the first frame sub-region NAI1 to the second frame sub-region NA12 through the bending region B.

As shown in FIG. 16, the touch display panel may include a contact groove 80. The other end of the touch wire 60 is electrically connected to the touch lead 70 through the contact groove 80. For example, the contact groove 80 may be in the first frame sub-region NA11, and more specifically, the contact groove 80 may be between the above-mentioned barrier dam and the bending region B.

In such embodiments, in the contact groove 80, the touch wire 60 is in contact with one end of touch lead 70, so as to achieve an electrical connection between the touch wire 60 and the touch lead 70.

The touch display panel may include a contact groove 800. For example, the contact groove 800 may be in the second frame sub-region NA12, that is, it is on a side of the bending region B away from the display area AA.

The touch display panel includes another touch wire 600. For example, the touch wire 600 may be in a same layer as the touch wire 60, that is, the touch wire 600 may be in at least one of the first touch layer 31 and the second touch layer 32. For example, the touch wire 600 may be in the second touch layer 32.

In the contact groove 800, the other end of the touch lead 70 is in contact with the touch wire 600, so as to achieve an electrical connection between the touch lead 70 and the touch wire 600.

In this way, the touch wire in the touch layer may be transferred to the touch lead in the fourth conductive layer in the bending region B, so that the touch lead may not be easily broken when the bending region B is bent. After passing through the bending region B, the touch lead in the fourth conductive layer may be transferred to another touch wire in the touch layer, which is beneficial to the electrical connection between the touch wire and an external circuit.

In the embodiments shown in FIG. 16, a contact between the touch lead 70 and the touch wire 600 in the contact groove 800 is a flat contact, but the embodiments of the present disclosure are not limited thereto. For example, the contact between the touch lead 70 and the touch wire 600 in the contact groove 800 may refer to the above-mentioned contact in the contact groove 80, that is, at least one of inclined surface contact and side surface contact may be adopted. Reference may be made to the above descriptions of the embodiments for the contact groove 80, which will not be repeated here.

Figure 17:
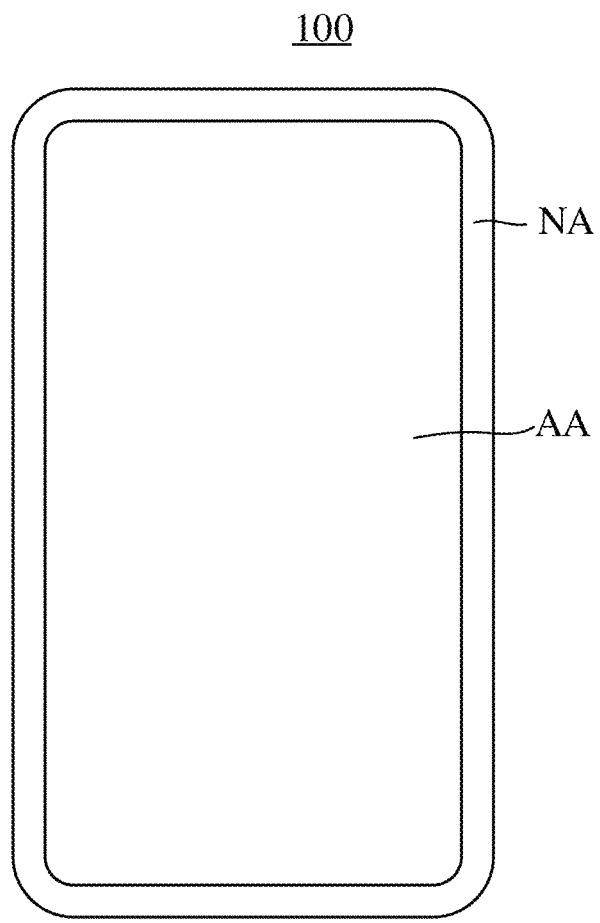
FIG. 17 shows a schematic diagram of a display device according to some exemplary embodiments of the present disclosure.

FIG. 17 shows a schematic diagram of a display device according to some exemplary embodiments of the present disclosure. A display device 100 includes the above-mentioned touch display panel. For example, the display device 100 includes the display area AA and the peripheral area NA, and the film layer structures in the display area AA and the peripheral area NA may refer to the descriptions of the embodiments described above, which will not be repeated here.

The display device may include any apparatus or product with a display function. For example, the display device may be a smart phone, a mobile phone, an e-book reader, a desktop personal computer (PC), a laptop PC, a netbook PC, a personal digital assistant (PDA), a portable multimedia player (PMP), a digital audio player, a mobile medical apparatus, a camera, a wearable apparatus (such as head-mounted apparatus, electronic clothing, electronic bracelet, electronic necklace, electronic accessory, electronic tattoo, or smart watch), a television, etc.

It will be understood that the display device according to the embodiments of the present disclosure has all the features and advantages of the touch display panel described above, and details may refer to the above descriptions.

Although some embodiments of a general technical concept of the present disclosure have been illustrated and described, it will be understood by those ordinary skilled in the art that those embodiments may be changed without departing from the principle and spirit of the general technical concept of the present disclosure. The scope of the present disclosure is defined by the claims and their equivalents.

What is claimed is:

1. A touch display panel, comprising:
a base substrate, wherein the base substrate comprises a display area and a peripheral area at least on at least one side of the display area;
a plurality of pixel units in the display area, wherein the pixel unit comprises a pixel driving circuit and a light-emitting element electrically connected to the pixel driving circuit, and the light-emitting element comprises a first electrode;
a plurality of touch electrodes in the display area;
a touch wire electrically connected to at least one touch electrode, wherein at least part of the touch wire extends to the peripheral area;
a touch lead in the peripheral area, wherein the touch lead and the touch wire are located in different conductive layers; and
a contact groove in the peripheral area, wherein the touch wire and the touch lead are in contact with each other in the contact groove,
wherein the touch wire comprises a first touch wire portion in the contact groove, the base substrate has an upper surface close to the pixel units, and the first touch wire portion extends obliquely with respect to the upper surface of the base substrate;
wherein the first touch wire portion is located on a groove bottom of the contact groove;
wherein the touch display panel further comprises a first supporting structure, wherein the first supporting structure comprises a first surface away from the base substrate, the first surface has a first portion, and an orthographic projection of the contact groove on the base substrate substantially coincides with an orthographic projection of the first portion of the first surface on the base substrate,
wherein the first portion of the first surface extends obliquely with respect to the upper surface of the base substrate.

2. The touch display panel according to claim 1, wherein the touch lead comprises a first touch lead portion and a second touch lead portion, the second touch lead portion serves as the groove bottom of the contact groove, the first touch lead portion is on a side of the second touch lead portion close to the display area, the first touch lead portion extends parallel to the upper surface of the base substrate, and the second touch lead portion extends obliquely with respect to the upper surface of the base substrate.

3. The touch display panel according to claim 1, wherein a width of a contact portion of the first touch wire portion and the second touch lead portion in an extension direction of the first touch wire portion is equal to a width of the contact groove in the extension direction of the first touch wire portion.

4. The touch display panel according to claim 1, wherein the first portion of the first surface has a first end close to the display area and a second end away from the display area, and a height of the first portion of the first surface at the second end is less than a height of the first portion of the first surface at the first end.

5. The touch display panel according to claim 4, wherein a difference between the height of the first portion of the first surface at the first end and the height of the first portion of the first surface at the second end ranges from 0.5 microns to 50 microns.

6. The touch display panel according to claim 5, wherein the second touch lead portion is in direct contact with the first portion of the first surface.

7. The touch display panel according to claim 4, wherein the first surface further comprises a second portion on a side of the first portion of the first surface close to the display area, and the second portion of the first surface extends parallel to the upper surface of the base substrate.

8. The touch display panel according to claim 7, further comprising a second supporting structure on a side of the first supporting structure away from the base substrate, wherein an orthographic projection of the second supporting structure on the base substrate at least partially overlaps with an orthographic projection of the second portion of the first surface on the base substrate; and
wherein a part of the first touch lead portion is sandwiched between the first supporting structure and the second supporting structure;
wherein the first touch lead portion is in direct contact with the second portion of the first surface.

9. The touch display panel according to claim 8, further comprising a first encapsulation sub-layer, a second encapsulation sub-layer and a third encapsulation sub-layer sequentially arranged away from the base substrate;
wherein the touch display panel further comprises a first covering structure in the peripheral area, and the first covering structure is located in at least one of the first encapsulation sub-layer and the third encapsulation sub-layer;
wherein an orthographic projection of a side surface of the first covering structure away from the display area on the base substrate falls within the orthographic projection of the second portion of the first surface on the base substrate;
wherein the first covering structure comprises a first portion, and an orthographic projection of the first portion of the first covering structure on the base substrate falls within an orthographic projection of the second supporting structure on the base substrate; and
wherein the first portion of the first covering structure has a first surface away from the base substrate, and the first surface of the first portion of the first covering structure extends obliquely with respect to the upper surface of the base substrate.

10. The touch display panel according to claim 1, wherein the light-emitting element further comprises a second electrode and a light-emitting layer between the first electrode and the second electrode, the pixel driving circuit comprises a storage capacitor and at least one thin film transistor on the base substrate, the thin film transistor comprises an active layer, a gate electrode, a source electrode and a drain electrode, and the storage capacitor comprises a first electrode plate and second electrode plate;
wherein the touch display panel comprises:
a first conductive layer on a side of the active layer away from the base substrate, wherein the gate electrode and the first electrode plate are in the first conductive layer;
a second conductive layer on a side of the first conductive layer away from the base substrate, wherein the second electrode plate is located in the second conductive layer;
a third conductive layer on a side of the second conductive layer away from the base substrate, wherein the source electrode and the drain electrode are in the third conductive layer; and
a fourth conductive layer on a side of the third conductive layer away from the base substrate, wherein a connecting portion for electrically connecting the pixel driving circuit and the first electrode of the light-emitting element is in the fourth conductive layer,
wherein the touch lead is located in the fourth conductive layer.

11. The touch display panel according to claim 10, further comprising: a first touch layer on a side of the third encapsulation sub-layer away from the base substrate; and a second touch layer on a side of the first touch layer away from the base substrate, wherein the touch wire is in the first touch layer or the second touch layer;
wherein the touch display panel further comprises a first planarization layer between the third conductive layer and the fourth conductive layer, wherein the first supporting structure is in the first planarization layer;
wherein the touch display panel further comprises a second planarization layer between the fourth conductive layer and a layer where the first electrode of the light-emitting device is located, wherein the second supporting structure is located in the second planarization layer;
wherein the touch display panel further comprises a plurality of insulating layers between the fourth conductive layer and the base substrate, wherein the first supporting structure comprises a structure located in at least one of the plurality of insulating layers;
wherein the first supporting structure comprises a first supporting sub-structure in the third conductive layer and a second supporting sub-structure in the first planarization layer.

12. A display device, comprising the touch display panel according to claim 1.

13. A touch display panel, comprising:
a base substrate, wherein the base substrate comprises a display area and a peripheral area at least on at least one side of the display area;
a plurality of pixel units in the display area, wherein the pixel unit comprises a pixel driving circuit and a light-emitting element electrically connected to the pixel driving circuit, and the light-emitting element comprises a first electrode;
a plurality of touch electrodes in the display area;
a touch wire electrically connected to at least one touch electrode, wherein at least part of the touch wire extends to the peripheral area;
a touch lead in the peripheral area, wherein the touch lead and the touch wire are located in different conductive layers; and
a contact groove in the peripheral area, wherein the touch wire and the touch lead are in contact with each other in the contact groove,
wherein the touch wire comprises a first touch wire portion in the contact groove, the base substrate has an upper surface close to the pixel units, and the first touch wire portion extends obliquely with respect to the upper surface of the base substrate;
wherein the first touch wire portion is located on a groove sidewall of the contact groove;
wherein the touch lead comprises a first touch lead portion, a second touch lead portion and a fourth touch lead portion, the second touch lead portion serves as a groove bottom of the contact groove, the fourth touch lead portion serves as a part of the groove sidewall of the contact groove, the first touch lead portion is on a side of the second touch lead portion close to the display area, and the fourth touch lead portion is between the first touch lead portion and the second touch lead portion;

wherein the first touch lead portion extends parallel to the upper surface of the base substrate, the second touch lead portion extends parallel to the upper surface of the base substrate, and the fourth touch lead portion extends obliquely with respect to the upper surface of the base substrate; and wherein the first touch wire portion is in contact with the fourth touch lead portion.

14. The touch display panel according to claim 13, wherein the touch wire further comprises a second touch wire portion in the contact groove, and the second touch wire portion is in contact with the second touch lead portion.

15. The touch display panel according to claim 14, wherein a width of a contact portion of the second touch wire portion and the second touch lead portion in an extension direction of the second touch wire portion is equal to a width of the contact groove in the extension direction of the second touch wire portion.

16. The touch display panel according to claim 13, further comprising a first supporting structure, wherein the fourth touch lead portion is on a sidewall of the first supporting structure away from the display area.

17. The touch display panel according to claim 16, wherein the first supporting structure comprises a first surface away from the base substrate, the first surface comprises a first portion, and the first portion of the first surface extends obliquely with respect to the upper surface of the base substrate; and wherein the fourth touch lead portion is in contact with the first portion of the first surface.

* * * * *